United States Patent
Lablans

(10) Patent No.: US 8,832,523 B2
(45) Date of Patent: Sep. 9, 2014

(54) MULTI-STATE SYMBOL ERROR CORRECTION IN MATRIX BASED CODES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 1019 days.

(21) Appl. No.: 12/400,900

(22) Filed: Mar. 10, 2009

(65) Prior Publication Data

US 2009/0172501 A1 Jul. 2, 2009

Related U.S. Application Data

(63) Continuation-in-part of application No. 11/680,719, filed on Mar. 1, 2007.

(60) Provisional application No. 60/779,068, filed on Mar. 3, 2006, provisional application No. 61/035,563, filed on Mar. 11, 2008.

(51) Int. Cl.
*H03M 13/00* (2006.01)
*H03M 13/29* (2006.01)
*G06F 11/10* (2006.01)

(52) U.S. Cl.
CPC .......... *H03M 13/29* (2013.01); *G06F 11/1012* (2013.01); *G06F 11/1028* (2013.01)
USPC .............................. 714/755; 714/781; 714/756

(58) Field of Classification Search
CPC . H03M 13/29; G06F 11/1012; G06F 11/1028
USPC .......................................... 714/781, 755, 756
See application file for complete search history.

(56) References Cited

U.S. PATENT DOCUMENTS

| | | | | |
|---|---|---|---|---|
| 3,648,239 A | * | 3/1972 | Carter et al. | 714/758 |
| 4,099,160 A | * | 7/1978 | Flagg | 714/785 |
| 4,142,174 A | * | 2/1979 | Chen et al. | 714/784 |
| 4,320,510 A | * | 3/1982 | Kojima | 714/755 |
| 4,402,045 A | * | 8/1983 | Krol | 712/29 |
| 4,413,339 A | * | 11/1983 | Riggle et al. | 714/765 |
| 4,494,234 A | * | 1/1985 | Patel | 714/765 |
| 4,498,175 A | * | 2/1985 | Nagumo et al. | 714/756 |
| 4,527,269 A | * | 7/1985 | Wood et al. | 714/703 |
| 4,553,237 A | | 11/1985 | Nakamura et al. | |
| 4,566,105 A | * | 1/1986 | Oisel et al. | 714/756 |
| 4,567,594 A | * | 1/1986 | Deodhar | 714/769 |
| 4,747,103 A | * | 5/1988 | Iwamura et al. | 714/755 |

(Continued)

OTHER PUBLICATIONS

Wenjing Rao, et al., Fault Tolerant Arithmetic with Applications in Nanotechnology based Systems, ITC International Test Conference 2004 Oct. 26-28, 2004, pp. 472-478, Charlotte, NC, USA.

(Continued)

*Primary Examiner* — Joseph D Torres

(57) ABSTRACT

Methods and apparatus create codewords of n-state symbols having one of 3 or more states with n-state check symbols. Check symbols are created from independent expressions. Codewords are associated with a matrix for detection of one or more symbols in error and the location of such symbols in error. Symbols in error are reconstructed from symbols not in error, error syndromes and check symbols not in error. Deliberately created errors that can be corrected are used as nuisance errors.

20 Claims, 7 Drawing Sheets

| x1 | x2 | x3 | x4 | t1 |
|---|---|---|---|---|
| y1 | y2 | y3 | y4 | t2 |
| v1 | v2 | v3 | v4 | t3 |
| z1 | z2 | z3 | z4 | t4 |
| p1 | p2 | p3 | p4 | |
| q1 | q2 | q3 | q4 | |
| r1 | r2 | r3 | r4 | |

(56) References Cited

U.S. PATENT DOCUMENTS

| | | | |
|---|---|---|---|
| 4,873,688 A * | 10/1989 | Maki et al. | 714/784 |
| 4,928,280 A | 5/1990 | Nielson et al. | |
| 4,937,829 A * | 6/1990 | Kadokawa | 714/757 |
| 5,315,600 A * | 5/1994 | Iwamura et al. | 714/757 |
| 5,325,373 A * | 6/1994 | Iwamura et al. | 714/784 |
| 5,355,412 A * | 10/1994 | Kangas | 713/161 |
| 5,386,425 A | 1/1995 | Kim | |
| 5,430,739 A * | 7/1995 | Wei et al. | 714/784 |
| 5,440,570 A * | 8/1995 | Wei et al. | 714/782 |
| 5,479,416 A * | 12/1995 | Snodgrass et al. | 714/785 |
| 5,517,509 A * | 5/1996 | Yoneda | 714/785 |
| 5,541,937 A * | 7/1996 | Iwamura | 714/785 |
| 5,712,861 A * | 1/1998 | Inoue et al. | 714/752 |
| 5,715,262 A * | 2/1998 | Gupta | 714/784 |
| 5,754,563 A * | 5/1998 | White | 714/757 |
| 5,771,244 A * | 6/1998 | Reed et al. | 714/752 |
| 5,771,245 A | 6/1998 | Zhang | |
| 5,974,580 A * | 10/1999 | Zook et al. | 714/755 |
| 6,145,110 A * | 11/2000 | Khayrallah | 714/752 |
| 6,851,086 B2 | 2/2005 | Szymanski | |
| 7,000,167 B2 | 2/2006 | Coker et al. | |
| 7,116,250 B2 | 10/2006 | Coene | |
| 7,539,927 B2 * | 5/2009 | Lee et al. | 714/784 |
| 2004/0003333 A1 * | 1/2004 | Herley et al. | 714/748 |

OTHER PUBLICATIONS

Wong, et al. Using Multi-Dimensional Parity-Check Codes to Obtain Diversity in Rayleigh Fading Channels, URL: www.dsp.ufl.edu/~twong/Preprints/00965675.pdf, pp. 1210-1214, 2001.

Tee, et al., Multilevel generalised low-density parity-check codes, Electronics Letters, 2 pages, Feb. 2, 2006 vol. 42 No. 3.

Bernard Sklar, A primer on turbo code concepts, IEEE Communications Magazine, Dec. 1997, p. 94-102.

Xilinx LogiCORE™, IEEE 802.16 Compatible Turbo Product Code Encoder v1.0, Product Specification, Oct. 30, 2002, 5 pages.

Valles, et al., Hamming Codes Are Rate-Efficient Array Codes, IEEE Globecom 2005, p. 1320-1324.

Pohlmann, Ken C., "The Compact Disc; a handbook of theory and use", *The Computer music and digital audio series*; vol. 5 A-R Editions, Inc. Madison, WI 1989, (1989), 58-61.

* cited by examiner

|  | column1 | column2 | column3 | column4 |
|---|---|---|---|---|
| row1 | d11 | d12 | d13 | q1 |
| row2 | d21 | d22 | d23 | q2 |
| row3 | d31 | d32 | d33 | q3 |
| row4 | p11 | p12 | p13 | q4 |
| row5 | p21 | p22 | p23 | q5 |

FIG. 1

| x1 | x2 | x3 | x4 | t1 |
|---|---|---|---|---|
| y1 | y2 | y3 | y4 | t2 |
| v1 | v2 | v3 | v4 | t3 |
| z1 | z2 | z3 | z4 | t4 |
| p1 | p2 | p3 | p4 | tt1 |
| q1 | q2 | q3 | q4 | tt2 |
| r1 | r2 | r3 | r4 | tt3 |

FIG. 2

| x1 | x2 | x3 | x4 | t1 |
|----|----|----|----|----|
| y1 | y2 | y3 | y4 | t2 |
| v1 | v2 | v3 | v4 | t3 |
| z1 | z2 | z3 | z4 | t4 |
| p1 | p2 | p3 | p4 |    |
| q1 | q2 | q3 | q4 |    |
| r1 | r2 | r3 | r4 |    |

FIG. 5

| x1 | x2 | x3 | x4 | t1 |
|----|----|----|----|----|
| y1 | y2 | y3 | y4 | t2 |
| v1 | v2 | v3 | v4 | t3 |
| z1 | z2 | z3 | z4 | t4 |
| p1 | p2 | p3 | p4 |    |
| q1 | q2 | q3 | q4 |    |
| r1 | r2 | r3 | r4 |    |

FIG. 6

| ae11 | ae12 | ae13 | e14 | error | | |
|------|------|------|------|-------|--|--|
| e21 | ae22 | ae23 | ae24 | error | | |
| | | | | | | |
| | | | | | | |
| e51 | e52 | ae53 | ae54 | error | | |
| error | error | error | error | | | |
| | | | | | | |
| | | | | | | |

FIG. 7

| x11 | x12 | x13 | x14 | s11 | s12 | s13 |
|-----|-----|-----|-----|-----|-----|-----|
| x21 | x22 | x23 | x24 | s21 | s22 | s23 |
| x31 | x32 | x33 | x34 | s31 | s32 | s33 |
| x41 | x42 | x43 | x44 | s41 | s42 | s43 |
| x51 | x52 | x53 | x54 | s51 | s52 | s53 |
| r11 | r12 | r13 | r14 | | | |
| r21 | r22 | r23 | r24 | | | |
| r31 | r32 | r33 | r34 | | | |

MULTI-STATE SYMBOL ERROR CORRECTION IN MATRIX BASED CODES

STATEMENT OF RELATED CASES

This application is a continuation-in-part of U.S. patent application Ser. No. 11/680,719 filed on Mar. 1, 2007 which claims the benefit of U.S. Provisional Patent Application Ser. No. 60/779,068 filed on Mar. 3, 2006, which are both incorporated herein by reference in their entirety. This application also claims the benefit of U.S. Provisional Patent Application Ser. No. 61/035,563 filed on Mar. 11, 2008, which is incorporated herein by reference in its entirety.

BACKGROUND OF THE INVENTION

The present invention relates to correction of one or more multi-state symbols in error in a sequence of symbols which can be ordered in a matrix. More specifically, it relates to error correction by first identifying the location of possible errors in a matrix of multi-state symbols, followed by reconstruction of the original symbols from the remaining symbols believed to be not in error.

Error correction in a plurality of multi-state symbols or a sequence of binary symbols representing multi-state symbols is known, especially in the field of communications and information storage or transfer. In general, a series of symbols that is being transferred may have experienced interference or noise on a transmission channel. Possibly the storage medium, such as an optical or magnetic disk, may have been damaged. As a consequence, a received sequence of multi-state symbols may be different from the sequence from which it originated. The difference between an original sequence of symbols and a received sequence may be considered to be errors.

Error control measures can be applied to detect and to correct errors. These measures in general comprise adding additional symbols to a sequence, based on the existing symbols in the original sequence. The redundancy of symbols allows for detection and sometimes correction of errors.

It usually requires a greater number of redundant symbols than errors to correct errors compared to the process of merely detecting that symbols are in errors. For instance, in data communications, wherein re-sending of information is possible and not detrimental to the quality of data transfer, it may be sufficient to detect errors and request the transmitter to resend the symbols. However, in many applications resending of symbols is impossible or undesirable. In such cases error correction is desirable and more symbols are added to a sequence of symbols to enable error correction.

Error-correction techniques for symbols in a sequence attempt to achieve the best result with as few redundant symbols as possible, and with as limited processing requirements and memory or storage requirements as possible. Error correcting redundancy is usually set to address some maximum or optimal expected symbol error ratio. If information is coded into codewords, it is to be expected that many codewords are error-free and in error-free codewords extra symbols provided for error correction or detection are truly redundant.

It is known in error correcting codes like Reed Solomon codes, which is multi-state based, that k extra symbols, which can be called check symbols, may allow at most ½k symbols in error to be corrected. Arranging of data symbols in a matrix such as a 2 dimensional matrix is known. Herein columns and rows may for instance represent a Reed Solomon codeword. Such a code is called a product code. A product code still has the disadvantage that redundancy in the codewords is not fully used to determine position of errors and based on the positions of errors in a matrix calculate the correct state for the symbols in error.

Accordingly, novel and improved methods and apparatus providing improved use of check symbols and redundancy in a multi-state symbol matrix are required.

SUMMARY OF THE INVENTION

In accordance with an aspect of the present invention an apparatus is provided for correcting errors in a sequence of k n-state data symbols, an n-state symbol being represented by a signal, with n>2, and k≥1, comprising, a memory enabled to store instructions, a processor that retrieves and executes instructions from the memory to perform the steps of receiving on an input a plurality of signals representing the sequence of k n-state symbols and p n-state check symbols with p≤k, each of the signals representing p n-state check symbols being generated by an implementation of one of p independent reversible n-state expressions using the k n-state symbols as variables, determining as an independent step which of up to p of the k n-state data symbols are potentially in error and solving as an independent step up to p independent n-state expressions to determine an n-state value for the up to p of the k n-state symbols that are potentially are in error, wherein the solving applies at least an implementation of an n-state reversible logic function that is determined by an n by n truth table.

In accordance with another aspect of the present invention the apparatus as provided further comprises instructions to perform receiving on the input one or more signals representing one or more check-the-check symbols to correct an error in one or more of the p n-state check symbols.

In accordance with yet another aspect of the present invention the apparatus as provided further comprises instructions to perform receiving on the input one or more signals representing one or more additional sequences of n-state symbols, each additional sequence containing k n-state data symbols and p n-state check symbols, each of the p n-state check symbols being generated by an implementation of one of p independent reversible n-state expressions with the k n-state symbols as variables, receiving on the input signals representing at least q*k n-state check symbols with q≥1 and q≤p, determining additional n-state data symbols in error by recalculating the n-state check symbols, and solving any additional errors of up to $p^2$ errors.

In accordance with yet another aspect of the present invention the apparatus is provided, wherein a first plurality of n-state check symbols is determined by using a first arrangement of the k n-state data symbols in a first matrix and a second plurality of n-state check symbols is determined by using a second arrangement of the k n-state data symbols in a second matrix.

In accordance with yet another aspect of the present invention the apparatus is provided wherein, p errors have deliberately been introduced as nuisance errors.

In accordance with yet another aspect of the present invention the apparatus is provided, wherein a position of an n-state data symbol in error is known to the apparatus.

In accordance with yet another aspect of the present invention the apparatus is provided, wherein instructions to solve the p errors are provided to the apparatus through a network.

In accordance with yet another aspect of the present invention the apparatus is provided, wherein instructions to solve the p errors are unique to the sequence of k n-state symbols.

In accordance with yet another aspect of the present invention the apparatus is provided, wherein the apparatus is part of a communication system.

In accordance with yet another aspect of the present invention the apparatus is provided, wherein the apparatus is part of at least one of the group consisting of an audio player, a video player, a data storage device, and a communication device.

In accordance with a further aspect of the present invention a method is provided for by a processor correcting of errors in a sequence of k n-state data symbols, an n-state symbol being represented by a signal, with n>2, and k≥1, comprising, receiving on an input of the processor a plurality of signals representing the sequence of k n-state symbols and p n-state check symbols with p≤k, each of the signals representing p n-state check symbols being generated by an implementation of one of p independent reversible n-state expressions using the k n-state symbols as variables, determining as an independent step which of up to p of the k n-state data symbols are potentially in error, and solving as an independent step up to p independent n-state expressions to determine an n-state value for the up to p of the k n-state symbols that are potentially are in error, wherein the solving applies at least an implementation of an n-state reversible logic function that is determined by an n by n truth table.

In accordance with yet a further aspect of the present invention the method as provided further comprises receiving on the input one or more signals representing one or more check-the-check symbols to correct an error in one or more of the p n-state check symbols.

In accordance with yet a further aspect of the present invention the method as provided further comprises receiving on the input one or more signals representing one or more additional sequences of n-state symbols, each additional sequence containing k n-state data symbols and p n-state check symbols, each of the p n-state check symbols being generated by an implementation of one of p independent reversible n-state expressions with the k n-state symbols as variables, receiving on the input signals representing at least q*k n-state check symbols with q≥1 and q≤p, determining additional n-state data symbols in error by recalculating the n-state check symbols, and solving any additional errors of up to $p^2$ errors.

In accordance with yet a further aspect of the present invention the method is provided, wherein a first plurality of n-state check symbols is determined by using a first arrangement of the k n-state data symbols in a first matrix and a second plurality of n-state check symbols is determined by using a second arrangement of the k n-state data symbols in a second matrix.

In accordance with yet a further aspect of the present invention the method is provided, wherein p errors have been introduced deliberately.

In accordance with yet a further aspect of the present invention the method is provided, wherein a position of an n-state data symbol in error is known to the apparatus.

In accordance with yet a further aspect of the present invention the method is provided, wherein instructions to solve the p errors are provided to the processor through a network.

In accordance with yet a further aspect of the present invention the method is provided, wherein instructions to solve the p errors are unique to the sequence of k n-state symbols.

In accordance with yet a further aspect of the present invention the method is provided, wherein the processor is part of at least one of the group consisting of an audio player, a video player, a data storage device, and a communication device.

In accordance with yet a further aspect of the present invention the method is provided, wherein the processor is part of a communication system.

In accordance with a further aspect of the present invention, novel methods and system are provided that will correct errors in a sequence of symbols by detecting which symbols are in error and then reconstructing the error symbol by n-state logic expressions with symbols in errors as unknowns.

In accordance with another aspect of the present invention, a method is provided for coding and decoding of a plurality of n-valued data symbols with n>2, comprising: associating the plurality of n-state data symbols with a k-dimensional matrix with k≥2; generating p check symbols with p≥1 for q instances with q≥2 of a first dimension of the first matrix, each check symbol in an instance of a first dimension being generated by applying an n-state logic expression with data symbols as variables; generating q check symbols for a plurality of instances of a second dimension of the k-dimensional matrix, each check symbol in an instance of a second dimension being generated by applying an n-state logic expression with data symbols as variables; associating the plurality of n-valued data symbols and generated check symbols with a second matrix of which the k-dimensional matrix is a submatrix and transmitting the symbols associated with the second matrix to a target; and correcting in a deterministic way at least p×q symbols in error in the second matrix.

In accordance with a further aspect of the present invention, a method is provided for coding and decoding of a plurality of n-valued data symbols with n>2, further comprising correcting in a deterministic way up to p×q×q errors in the second matrix.

In accordance with another aspect of the present invention, a method is provided for coding and decoding of a plurality of n-valued data symbols with n>2, further comprising correcting in an iterative way more than p×q symbols in error.

In accordance with a further aspect of the present invention, a method is provided for coding and decoding of a plurality of n-valued data symbols with n>2, further comprising a second set of check symbols associated with the second matrix, wherein each check symbol in the second set of check symbols is generated from an expression with two or more check symbols generated from n-state data symbols as variables.

In accordance with another aspect of the present invention, a method is provided for coding and decoding of a plurality of n-valued data symbols with n>2, wherein one or more check symbols generated from n-state data symbols and two or more check symbols from the second set of check symbols form a Reed Solomon codeword.

In accordance with a further aspect of the present invention, a method is provided for coding and decoding of a plurality of n-valued data symbols with n>2, wherein an expression for generating a check symbol is defined in GF(n).

In accordance with another aspect of the present invention, a method is provided for coding and decoding of a plurality of n-valued data symbols with n>2, wherein an expression is implemented in binary logic.

In accordance with a further aspect of the present invention, a method is provided for coding and decoding of a plurality of n-valued data symbols with n>2, further comprising: determining a magnitude of an error for a symbol in error; and adjusting a symbol in error with the magnitude of the error.

In accordance with another aspect of the present invention, a system is provided for coding and decoding of a plurality of n-state data symbols with n>2, comprising: a processor enabled to execute instructions upon the n-state data symbols; means to store the instructions; and instructions enabled to perform the steps of: associating the plurality of n-state data symbols with a k-dimensional matrix with k≥2; generating p check symbols with p≥1 for q instances with q≥2 of a first dimension of the first matrix, each check symbol in an instance of a first dimension being generated by applying an n-state logic expression with data symbols as variables; generating q check symbols for a plurality of instances of a second dimension of the k-dimensional matrix, each check symbol in an instance of a second dimension being generated by applying an n-state logic expression with data symbols as variables; associating the plurality of n-valued data symbols and generated check symbols with a second matrix of which the k-dimensional matrix is a sub-matrix and transmitting the symbols associated with the second matrix to a target; and correcting in a deterministic way at least p×q symbols in error in the second matrix.

In accordance with a further aspect of the present invention, a system is provided for coding and decoding of a plurality of n-state data symbols with n>2, further comprising correcting in a deterministic way up to p×q×q errors in the second matrix.

In accordance with another aspect of the present invention, a system is provided for coding and decoding of a plurality of n-state data symbols with n>2, further comprising correcting in an iterative way more than p×q symbols in error.

In accordance with a further aspect of the present invention, a system is provided for coding and decoding of a plurality of n-state data symbols with n>2, further comprising a second set of check symbols associated with the second matrix, wherein each check symbol in the second set of check symbols is generated from an expression with two or more check symbols generated from n-state data symbols as variables.

In accordance with another aspect of the present invention, a system is provided for coding and decoding of a plurality of n-state data symbols with n>2, wherein one or more check symbols generated from n-state data symbols and two or more check symbols from the second set of check symbols form a Reed Solomon codeword.

In accordance with a further aspect of the present invention, a system is provided for coding and decoding of a plurality of n-state data symbols with n>2, wherein an expression for generating a check symbol is defined in GF(n).

In accordance with another aspect of the present invention, a system is provided for coding and decoding of a plurality of n-state data symbols with n>2, wherein an expression is implemented in binary logic.

In accordance with a further aspect of the present invention, a system is provided for coding and decoding of a plurality of n-state data symbols with n>2, further comprising: determining a magnitude of an error for a symbol in error; and adjusting a symbol in error with the magnitude of the error.

In accordance with another aspect of the present invention, a method is provided for coding and decoding of n-state data symbols, an n-state symbol able to assume one of n states with n>2, comprising, associating the n-state data symbols with a k-dimensional matrix with k>2; generating p independent n-state check symbols with q instances of a first dimension of the k-dimensional matrix, generating q independent n-state check symbols with p instances of a second dimension of the k-dimensional matrix; associating the n-state data symbols and check symbols with a second matrix which has the k-dimensional matrix as a sub-matrix; determining that m instances of the first dimension of the k-dimensional matrix are in error with m>p but not more than q instances of the second dimension of the k-dimensional matrix are in error; and solving up to m×q symbols in error from the second matrix.

In accordance with another aspect of the present invention, a method is provided for coding and decoding of n-state data symbols, an n-state symbol able to assume one of n states with n>2, further comprising: making a symbol that is in an instance of a first and a second dimension in error of the second matrix an unknown in an equation; and solving q unknowns in an instance of second dimension of the second matrix from a set of q independent equations.

In accordance with another aspect of the present invention, a method is provided for coding and decoding of n-state data symbols, an n-state symbol able to assume one of n states with n>2, further comprising: determining a magnitude of an error for a symbols in error; and adjusting a symbol in error with the magnitude of the error.

DESCRIPTION OF THE DRAWINGS

FIG. 1 is a diagram of a matrix in accordance with an aspect of the present invention;

FIG. 2 is another diagram of a matrix in accordance with an aspect of the present invention;

FIG. 5 is yet is another diagram of a matrix in accordance with an aspect of the present invention;

FIG. 6 is yet is another diagram of a matrix in accordance with an aspect of the present invention;

FIG. 7 is yet is another diagram of a matrix in accordance with an aspect of the present invention;

FIG. 8 is yet is another diagram of a matrix in accordance with an aspect of the present invention;

DESCRIPTION OF A PREFERRED EMBODIMENT

Figure 3:
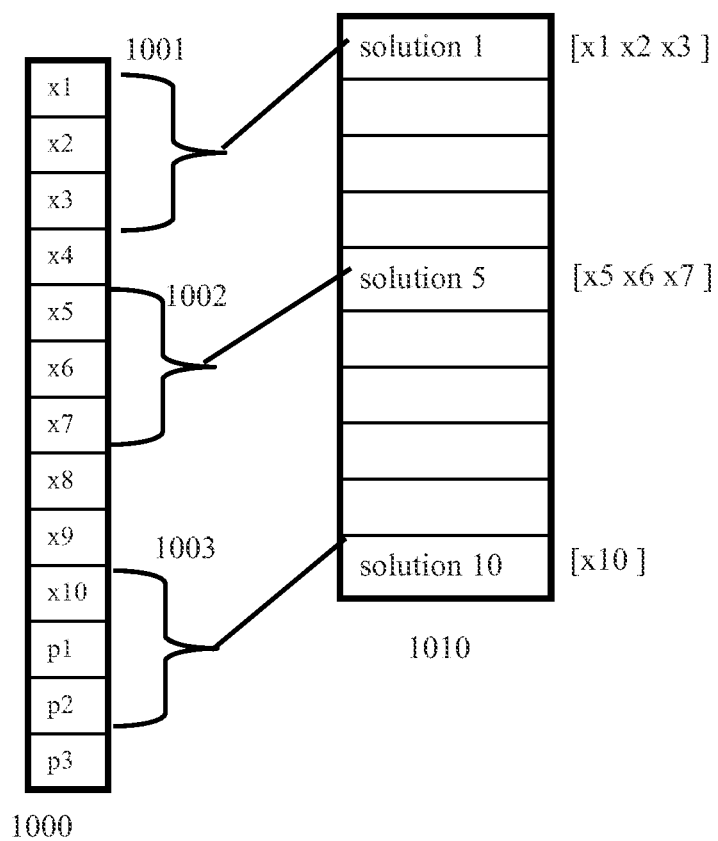
FIG. 3 is a diagram of an equation solver in accordance with an aspect of the present invention.

According to one aspect of the present invention, an error correcting code is provided for a matrix of multi-state symbols enhanced with check symbols.

Herein, the terms multi-state, n-state, multi-valued and n-valued symbol will mean a symbol which may assume one of 3 or more states, which distinguishes it from binary symbols or bits which can only assume one of 2 states. Furthermore, the terms state or value and multi-state or multi-valued will be used interchangeably. The logic functions that are provided herein represent the switching of states. A state may be represented by a digit or a number. This may create the impression that an actual value is attached to a state. One may, to better visualize states, assign a value to a state. However, that is not a requirement for a state. A name or designation of a state is just to indicate that it is different from states with different designations. Because some logic functions herein represent an adder the names state and value may be used meaning the same.

Furthermore, because of the practice in binary logic to represent a state by a physical level of a signal such as a voltage, one often assumes that different n-state signals have different levels of a signal, such as voltage or intensity. While such representations of a state are allowed it is not limited to that. A state may be represented by independent phenomena. For instance, different states of a signal may be represented by different wavelengths of an optical signal. A state may also be represented by a presence of a certain material, by a quantum-mechanical phenomenon, or by any other phenomenon that can distinguish a state from another state.

Furthermore, a symbol, which is regarded herein as a single element, may also be represented by 2 or more p-state symbols wherein p<n. For instance, a 4-state symbol may be represented by 2 binary symbols.

The generation of check symbols, especially in sequences of binary symbols, is known, and either a parity symbol or a combination of symbols representing a checksum is generated. One may also generate n-valued check symbols by applying n-valued symbols to one or more n-valued logic functions. For instance, one may have a sequence of 4 4-valued data symbols [d1 d2 d3 d4]. One may create a check symbol c (or the fifth symbol in the sequence) by for instance adding modulo-4 the value (or representation of the state of each data symbol) of each data symbol. One has thus created the sequence [d1 d2 d3 d4 c]. Assume d1=0; d2=2; d3=2; and d4=3. Then c=(d1+d2+d3+d4)mod-4=(7)mod-4=3.

This is merely an example. The symbols are n-state, with at this stage no limitation to the number of states (just n>2). The functions can be any n-valued switching function, related to the n-state of the symbols. For error correction an n-valued function for determining a check symbol is preferably a reversible n-valued logic function. While it seems strange, one may also solve equations with non-reversible n-valued logic functions. A non-reversible n-valued logic function has a truth table with at least one row or column that has two identical output states for different input states. By providing sufficient different equations one can address the uncertainty related to the states of for instance inputs (x1, x2) and (x1, x3) generating the same output state d1.

In accordance with a further aspect of the present invention, one should arrange a sequence of symbols in a matrix. For instance a sequence of 9 multi-state symbols d12, d12, d13, d21, d22, d23, d31, d32 and d33 can be arranged in a 2-dimensional matrix as shown in FIG. 1 having rows and columns. To each row of data symbols at least one check symbol qi (q1, q2 and q3) is added. Further more to each column 2 check symbols p and p are added. Each check symbol is created from data symbols in its respective row or column. One may also create a first check symbol from data symbols and a second symbol from data symbols and the first check symbol. FIG. 1 is merely an illustrative example. One may have a multi-dimensional matrix (more than 2 dimensions). Multi-dimensional matrices are fully contemplated and the term row and column are extended to other dimensions in a multi-dimensional matrix. One may have more or fewer check symbols per column or row. One may have no check symbols in one or more rows or columns. One may also have a different number of check symbols in each row or each column.

The position of a check symbol in a row or a column is shown for illustrative purposes at the end of a row or the bottom of a column. It should be clear that one may position a check symbol anywhere in a matrix as long as one knows from which data symbols a check symbol is determined.

A sequence of symbols can be arranged in a matrix for analysis and determination of check symbols. It should be clear that the symbols are usually not transmitted in a matrix. One does not have to arrange symbols in an actual matrix for analysis. It is required that one knows the relationships between data symbols and check symbols and how two or more different check symbols may have at least one data symbol in common.

A preferred embodiment as one aspect of the present invention, is to first identify which symbols in a matrix are possibly in error, and based on a selected coding scheme reconstruct the symbols that were detected as being possibly in error by using reversing equations. Assume that in a 2-dimensional matrix each row has p check symbols and each column has q check symbols and no more than q rows or no more than p columns are in error one may solve up to pxq errors in a deterministic manner. A row or a column being in error herein means that a row or a column has at least one check symbol which after being recalculated has a value or state different from its received value. With more columns or rows in error one may apply an iterative scheme, based on making an initial assumption about at least one symbol that can possibly be in error in actuality not being in error. Based on such an assumption one may then calculate the values or states of remaining symbols that may be in error. If the thus calculated values result in an error free matrix there is a high probability that the assumption was correct and that the calculated values are correct. If such an assumption leads to a matrix still containing errors there is a high probability that the assumption was wrong and a different assumption has to be tried, until an error free matrix is achieved.

The advantage of a Reed Solomon code is that each word having 2×k check symbols may correct up to k errors. However in light of the complexity of solving for instance an error location polynomial, solving errors is a relatively complex process. If one can identify location of errors, reconstruction of the symbol in errors is relatively simple.

Reconstruction of symbols (including n-valued symbols) in error based on known correct symbols has been demonstrated by the Applicant in U.S. patent application Ser. No. 11/566,725, filed on Dec. 5, 2006 entitled ERROR CORRECTING DECODING FOR CONVOLUTIONAL AND RECURSIVE SYSTEMATIC CONVOLUTIONAL ENCODED SEQUENCES, which is incorporated herein in its entirety by reference. Reconstruction of symbols in error in Reed Solomon codes and in what the Applicant calls Reed-Solomon like codes also are described in U.S. Non-provisional patent application Ser. No. 11/739,189, filed on Apr. 24, 2007, which claims the benefit of U.S. Provisional Patent Application Ser. No. 60/807,087 filed Jul. 12, 2006; U.S. Non-provisional patent application Ser. No. 11/743,893, filed on May 3, 2007, which claims the benefit of U.S. Provisional Patent Application Ser. No. 60/821,980 filed Aug. 10, 2006, which are all four incorporated herein by reference in their entirety.

Especially in a matrix wherein errors are distributed in such a way that only a limited number of rows or columns (or on dimensions in a multi-dimensional matrix) are in error, the use of Reed Solomon codes may be excessive and use of error detection and symbol reconstruction as provided herein as an aspect of the present invention may be simpler and more effective, achieving a bigger "bang-for-the-buck" so to speak for each check symbol.

The issue with matrix based codes is that multiple errors may hide errors by creating a check symbol that appears to be correct. Assume that the previously provided example before transmission creates the sequence: [d1 d2 d3 d4 c]. Wherein d1=0; d2=2; d3=2; and d4=3 and c=(d1+d2+d3+d4)mod-4=(7)mod-4=3. Accordingly, [d1 d2 d3 d4 c]=[0 2 2 3 3]. Assume that after transmission one receives [0 2 3 2 3]. Both d3 and d4 are in error. However when one recalculates the check symbol one determines c=3. Based on that it is impossible to determine that two errors have occurred. The errors cancel each other out in determining the check symbol. In other words the errors are hidden. It was shown by the inventor in U.S. patent application Ser. No. 11/969,560 filed on Jan. 4, 2008, which is incorporated herein by reference, that errors in a matrix code can be unhidden by applying check symbols which are determined from different arrangements of symbols in a matrix.

In accordance with an aspect of the present invention, one can solve a set of p errors in a plurality of symbols if one has p independent equations wherein the p symbols in errors are the unknowns.

Independent Equations for Determining Check Symbols

Binary check symbols or parity bits are based on a limited relationship between the constituting bits. The relationship is commonly established by the binary XOR function. N-valued check symbols can have more varied reversible relationships as was explained in the earlier cited application Ser. No. 11/680,719. For instance one may have a word of 4 n-valued symbols [a b c d]. One may create a first n-valued check symbol $c1=a \oplus b \oplus c \oplus d$. One may also create a second check symbol $c2=a \otimes b \otimes c \otimes d$. If only one of the symbols a, b, c or d is in error one can reconstruct the symbol in error both from c1 or c2 if these are not in error and both $\oplus$ and $\otimes$ are reversible operations. It should also be clear that two symbols in error can be reconstructed if the equations for c1 and c2 are independent and the operations are reversible. Calculation of c1 and c2 by $\oplus$ and $\otimes$ may be independent because the operations are different and/or independent. The equations for c1 and c2 may be independent because the symbols a, b, c and d are processed with the same function but with for instance different n-valued inverters. For instance, $c2=a \oplus 2b \oplus 3c \oplus 2d$ in an n-valued code. The advantage of using n-valued coders with LFSRs either in Galois or in Fibonacci configuration is that each next generated check symbol has an independent equation from another check symbol in the code. That is a reason why Reed Solomon (RS) codes work as error correcting codes.

The advantage of using an LFSR is that one does not need to execute each expression or equation in full to generate a check symbol. The appropriate configuration of the LFSR takes care of generating the check symbols in accordance with independent expressions or equations. The drawback of the RS code is that the location of an error first has to be found by for instance solving an error correction polynomial. In order to be able to do that for each error there have to be 2 check symbols. By knowing where the errors occur, for instance by using a matrix with error symbols derived from columns and rows, one may be able to use just one check symbol per error.

Methods for Solving N-Valued Error Equations

There are actually several different methods to solve the n-valued error equations. Which method one applies may depend on the complexity of the equations, the properties of the functions and which of the symbols are in error. The complexity and properties of functions is directly related to the value of n. For instance, if $n=2^p$ then one can use a function sc1 which is an addition over $GF(2^p)$ and multipliers over $GF(2^p)$. In that case sc1 is self-reversing, commutative and associative. This makes solving equations much easier. An illustrative example will be provided.

Under conditions where the position of an error symbol can be determined unambiguously, it is also possible to solve the equations unambiguously. If for some reason it is impossible or undesirable to solve equations in an algebraic fashion, one can solve the equations iteratively by using all possible values for the symbols in error. One will find only one combination of values that solves all equations correctly.

One method is to solve the equations in an algebraic fashion. In order to solve equations it is useful to review the rules for reversible, non-commutative and non-associative n-valued logic functions. Assume n-valued logic function 'sc' to be reversible, non-commutative and non-associative.

When (a sc b=c) then (b $sc^T$ a=c), with the truth table of $sc^T$ being the transposed of the truth table of sc.
When (a sc b=c) then (c scrc b=a), with the function 'scrc' being the reverse of 'sc' over constant columns.
When (a sc b=c) then (a scrr c=b), with the function 'scrr' being the reverse of 'sc' over constant rows.
When (b $sc^T$ a=c) then (b $sc^T$rr c=a), etc.

Assume a coder using 3 data symbols x1, x2 and x3 and generating two check symbols p1 and p2 using the following two equations for generating p1 and p2: p1={x1 sc2 (x2 sc1 x3)} and p2={p1 sc2 (x1 sc1 x2)}.

Algebraic method. As a first 4-valued example, assume that of [x1 x2 x3 p1 p2] x3 and p1 are in error. Clearly a first simple step is to solve p2={p1 sc2 (x1 sc1 x2)} which has p1 as unknown. One can rewrite the equation as: {p2 sc2rc (x1 sc1 x2)}=p1. The truth tables of sc1 and sc2 are provided in the following tables.

| sc1 | 0 | 1 | 2 | 3 |
|---|---|---|---|---|
| 0 | 0 | 1 | 2 | 3 |
| 1 | 1 | 0 | 3 | 2 |
| 2 | 2 | 3 | 0 | 1 |
| 3 | 3 | 2 | 1 | 0 |

| sc2 | 0 | 1 | 2 | 3 |
|---|---|---|---|---|
| 0 | 0 | 1 | 2 | 3 |
| 1 | 2 | 3 | 0 | 1 |
| 2 | 3 | 2 | 1 | 0 |
| 3 | 1 | 0 | 3 | 2 |

Herein the function sc2rc is the reverse of sc2 over constant columns. Its truth table is provided in the following table.

| sc2rc | 0 | 1 | 2 | 3 |
|---|---|---|---|---|
| 0 | 0 | 3 | 1 | 2 |
| 1 | 3 | 0 | 2 | 1 |
| 2 | 1 | 2 | 0 | 3 |
| 3 | 2 | 1 | 3 | 0 |

The assumption was that x3 and p1 were in error, so in the example the received codeword was [3 3 x3 p1 0] using the earlier example. Filling in the values in the equation provides p1={0 sc2rc (3 sc1 3)} or p1=0 sc2rc 0=0.

From p1={x1 sc2 (x2 sc1 x3)} wherein now only x3 is an unknown one can derive: (x2 sc1 x3)={x1 sc2rr p1} wherein sc2rr is the reverse of sc2 over constant rows. Keeping in mind that sc1 is self reversing: x3=x2 sc1 (x1 sc2rr p1). The truth table of sc2rr is provided in the following table.

| sc2rr | 0 | 1 | 2 | 3 |
|---|---|---|---|---|
| 0 | 0 | 1 | 2 | 3 |
| 1 | 2 | 3 | 0 | 1 |
| 2 | 3 | 2 | 1 | 0 |
| 3 | 1 | 0 | 3 | 2 |

Thus, x3=x2 sc1 (x1 sc2rr p1) leads to: x3=3 sc1 (3 sc2rr 0) or x3=3 sc1 1=2.

One may apply the same approach when x2 and x3 are in error. In that case, one may apply p2={p1 sc2 (x1 sc1 x2)} to achieve (x1 sc1 x2)=p1 sc2rr p2 and thus achieve x2=x1 sc1 (p1 sc2rr p2). This will provide x2=3. Etc.

A more difficult situation occurs when x1 and x2 are determined to be in error. The equations will be fairly difficult to solve. Assume that x1=e1 and x2=e2. The equations will then be:

p1={e1 sc2 (e2 sc1 x3)} and p2={p1 sc2 (e1 sc1 e2)}.

The value of p1 and p2 are correct. So one way to solve the equation in an iterative manner is to solve the equations:

t1={e1 sc2 (e2 sc1 x3)} and t2={p1 sc2 (e1 sc1 e2)} for all values of e1 and e2, and determine for which values of (e1,e2) the value (p1−t1) and (p2−t2) are both 0. Not surprisingly this will be the case for (e1,e2)=(3,3). This is a time consuming and not very elegant way to solve the problem, and may be a solution of last resort.

Fortunately for codes with for instance check symbols generated over $GF(2^p)$, one can also use a different approach. Within $GF(2^p)$ the addition can be a self reversing, commutative and associative function. An LFSR in $GF(2^p)$ can be realized with functions which are a combination of adders with multipliers to generate check symbols. One may also generate check symbols by evaluating an expression that determines the check symbol. One can reduce the functions by reduction of the truth tables according to the multipliers. This makes the execution of the coder quicker. In order to solve the equations one can revert back to associative adders with multipliers.

The need for solving errors of 2 symbols in a word may be because of the spill-over effect when one codes a symbol as for instance a binary word. One can never be sure that only an error in one symbol has occurred, so one should be prepared to solve the equations for two adjacent n-valued symbols in error. It is also possible that two errors have occurred in non adjacent symbols in a word. This assumes a different error behavior than for adjacent errors. Especially codewords generated by LFSRs (Galois and Fibonacci) that can be created by additions (with or without multipliers) over $GF(2^p)$, have easier to solve equations because of the associative properties of the addition function.

For instance, assume using again a 4-valued illustrative example wherein x1 and p1 are found to be in error. The generating expressions were: p1={x1 sc2 (x2 sc1 x3)} and p2={p1 sc2 (x1 sc1 x2)}. Assume an inverter inv2=[0 2 3 1] which is a 4-valued multiplier over GF(4). One can easily check that the inverter is multiplication over GF(4) with a factor 2. It can be checked that the function (a sc2 b) can be replaced by (inv2(a) sc1 b). One can then replace the generating expressions by the next expressions: p1={xt1 sc1 (x2 sc1 x3)} and p2={pt1 sc1 (x1 sc1 x2)} using the earlier defined functions. Herein xt1=inv2(x1) and pt1=inv2(p1) and sc1 commutative, self-reversing and associative. The way to approach this is to use arithmetic in $GF(2^2)$. The following rules apply using + and × in $GF(2^2)$.

| × | 0 | 1 | 2 | 3 |
|---|---|---|---|---|
| 0 | 0 | 0 | 0 | 0 |
| 1 | 0 | 1 | 2 | 3 |
| 2 | 0 | 2 | 3 | 1 |
| 3 | 0 | 3 | 1 | 2 |

Accordingly multiplication can be shown as:

|  | 1 | 2 | 3 |
|---|---|---|---|
| ×1 | 1 | 2 | 3 |
| ×2 | 2 | 3 | 1 |
| ×3 | 3 | 1 | 2 |

For instance, in $GF(2^2)$ under the earlier defined multiplication 2×2×1=3×1, etc.

Addition

| + | x1 | 2x1 | 3x1 |
|---|---|---|---|
| x1 | x1 + x1 = 0 | x1 + 2x1 = 3x1 | x1 + 3x1 = 2x1 |
| 2x1 | 2x1 + x1 = 3x1 | 2x1 + 2x1 = 0 | 2x1 + 3x1 = x1 |
| 3x1 | 3x1 + x1 = 2x1 | 3x1 + 2x1 = x1 | 3x1 + 3x1 = 0 |

The distributive property applies to a×(b+c)=a×b+a×c. Division is the inverse of multiplying.

| ÷ | 1 | 2 | 3 |
|---|---|---|---|
|  | 1 | 3 | 2 |

Accordingly, division by 1 is multiplying by 1; division by 2 is multiplying by 3; and division by 3 is multiplying by 2.

One can then write the equations as p1=2×x1+x2+x3 and p2=2×p1+x1+x2.

For instance, assume that x1 and x2 are known to be in error. Then x2=2×x1+x3+p1. Substitute in the p2 equation: p2=2×p1+x1+(2×x1+x3+p1) or 2×x1+x1=2×p1+p1+p2+x3, or 3×x1=3×p1+p2+x3. Dividing by 3 is multiplying by 2 so: x1=p1+2×p2+2×x3=0+2×0+2×2=3. Etc.

As another example, one may assume that not adjacent symbols x1 and p1 are in error. One must solve the equations then for x1. This leads to 2×x1=3×x2+2×x3+p2; or x1=2× x2+x3+3×p2=2×3+2+0=1+2=3. One achieves this result by applying the arithmetic rules in $GF(2^2)$ as stated before.

Galois field arithmetic may be preferred for solving the equations for in error symbols. However, these easy solutions may only be available for codewords defined in extension binary fields.

As an illustrative example, a 5 symbol 5-valued code will be generated with 3 data symbols and two check symbols generated by using 5-state switching function sc5, which is the mod-5 addition with the following truth table.

| sc5 | 0 | 1 | 2 | 3 | 4 |
|---|---|---|---|---|---|
| 0 | 0 | 1 | 2 | 3 | 4 |
| 1 | 1 | 2 | 3 | 4 | 0 |
| 2 | 2 | 3 | 4 | 0 | 1 |
| 3 | 3 | 4 | 0 | 1 | 2 |
| 4 | 4 | 0 | 1 | 2 | 3 |

The 5-valued equations for generating check symbols p1 and p2 are: p1={x1 sc5 (x2 sc5 2×x3)} and p2={p1 sc5 (x1 sc5 2×x2)} to generate codeword [x1 x2 x3 p1 p2]. Because sc5 is an addition (mod-5) one can write the equations as: p1=x1+x2+2×x3 and p2=p1+x1+2×x2. The check symbols can be generated by an LFSR.

For the 5-valued arithmetic the following truth table need to be used for multiplication × and subtraction −, meaning (a−b) wherein 'a' is the row and 'b' is the column of the truth table.

| − | 0 | 1 | 2 | 3 | 4 |
|---|---|---|---|---|---|
| 0 | 0 | 4 | 3 | 2 | 1 |
| 1 | 1 | 0 | 4 | 3 | 2 |
| 2 | 2 | 1 | 0 | 4 | 3 |
| 3 | 3 | 2 | 1 | 0 | 4 |
| 4 | 4 | 3 | 2 | 1 | 0 |

| × | 0 | 1 | 2 | 3 | 4 |
|---|---|---|---|---|---|
| 0 | 0 | 0 | 0 | 0 | 0 |
| 1 | 0 | 1 | 2 | 3 | 4 |
| 2 | 0 | 2 | 4 | 1 | 3 |
| 3 | 0 | 3 | 1 | 4 | 2 |
| 4 | 0 | 4 | 3 | 2 | 1 |

One should further keep in mind that dividing by 2 is multiplying with 3, dividing by 3 is multiplying by 2 and dividing by 4 is multiplying by 4. Further more 3×3=4 and 4×4=1, etc.

Accordingly, one will find for x1: p2=2x1+3x2+2x3 or 3p2=x1+4x2+x3 or x1=(3p2−4x2)−x3. The data symbols [x1 x2 x3]=[0 4 3] will generate [p1 p2]=[0 3]. One may calculate x1 and p1 from the other symbols (for instance when they are in error). The equation correctly provides: x1=(3×3−4×4)−3=(4−1)−3=0.

The methods here presented as different aspects of the present invention also apply to detection and correction of more than 2 errors, such as three errors. In order to detect k errors in a codeword of n symbols, each codeword in a set of codewords must have at least k+1 different symbols in common positions from any other codeword in the set. Or each codeword may at most have (n−k−1) symbols in common positions. The best one can do in a 7 symbol codeword to detect 3 errors is having at most 3 symbols in common. Such a code would require 8-valued symbols and is generally known as an RS-code. It is possible to meet the error detection requirement in a lower valued symbol codeword. However, that would require a codeword with more symbols. It is then understood that other and different examples of detection 3 errors in a codeword can be provided according to different aspects of the present invention.

As an illustrative example, an 8-valued 7 symbol codeword with 3 check symbols will be provided to demonstrate error correction when the position of errors is known.

One can identify the positions of the errors for instance by establishing a matrix as shown in FIG. 2. The data symbols occur sequentially as x1 ... x4, y1 ... y4, v1 ... v4, z1 ... z4. The symbols are broken up as 4 columns of 4 data symbols and horizontal check symbols t and tt are generated as well as vertical check symbols p, q, and r. The symbols tt are check symbols on the check symbols. The assumption in the example is that errors will occur as at most 3 errors in a column. One skilled in the art may, of course, design 2 or 3 dimensional matrices for different (also non adjacent) errors and different symbol error ratios as well as different codeword sizes.

Assume that all symbols in the illustrative examples are 8-valued. By running 8-valued coders on the received data symbols one can check the newly generated check symbols against the received check symbols and determine which rows and columns are in error, thus determining the position of the errors. Based on the known error positions and the coder one can reconstruct the correct symbols in the error positions.

The truth tables of the addition sc1 and multiplier over $GF(2^3)$ are provided in the following truth tables.

| + | 0 | 1 | 2 | 3 | 4 | 5 | 6 | 7 |
|---|---|---|---|---|---|---|---|---|
| 0 | 0 | 1 | 2 | 3 | 4 | 5 | 6 | 7 |
| 1 | 1 | 0 | 4 | 7 | 2 | 6 | 5 | 3 |
| 2 | 2 | 4 | 0 | 5 | 1 | 3 | 7 | 6 |
| 3 | 3 | 7 | 5 | 0 | 6 | 2 | 4 | 1 |
| 4 | 4 | 2 | 1 | 6 | 0 | 7 | 3 | 5 |
| 5 | 5 | 6 | 3 | 2 | 7 | 0 | 1 | 4 |
| 6 | 6 | 5 | 7 | 4 | 3 | 1 | 0 | 2 |
| 7 | 7 | 3 | 6 | 1 | 5 | 4 | 2 | 0 |

| × | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 3 | 4 | 5 | 6 | 7 | 1 |
| 3 | 0 | 3 | 4 | 5 | 6 | 7 | 1 | 2 |
| 4 | 0 | 4 | 5 | 6 | 7 | 1 | 2 | 3 |
| 5 | 0 | 5 | 6 | 7 | 1 | 2 | 3 | 4 |
| 6 | 0 | 6 | 7 | 1 | 2 | 3 | 4 | 5 |
| 7 | 0 | 7 | 1 | 2 | 3 | 4 | 5 | 6 |

The following table shows the division rule in $GF(2^3)$.

| ÷ | 1 | 2 | 3 | 4 | 5 | 6 | 7 |
|---|---|---|---|---|---|---|---|
| × | 1 | 7 | 6 | 5 | 4 | 3 | 2 |

Or division by 2 is multiplying by 7, division by 3 is multiplying by 6, etc.

Four data symbols [x y v z] in a column will generate 3 check symbols [p q r]. The equations for generating the check symbols are:

$$p=4x+y+y+2z;$$

$$q=4p+x+y+2v;$$

$$r=4q+p+x+2y.$$

The above check symbols may also be generated by an 8-valued LFSR. One can solve these equations for any of the 3 symbols to be unknown. As one example assume [x y v] to be in error. One can solve the linear equations by matrices or by substitution. Applying substitution one will find:

$$v=7p+4q+5r+z;$$

$$y=6p+6q+5r+6v;$$

$$x=p+4q+r+2y;$$

and thus with symbols [z p q r] known and error-free one can solve the equations.

A partial set of 7 8-valued symbol codeword generated by the above expressions is shown in the following table.

| x | y | v | z | p | q | r |
|---|---|---|---|---|---|---|
| 0 | 4 | 7 | 2 | 2 | 3 | 4 |
| 1 | 3 | 7 | 1 | 0 | 3 | 7 |
| 2 | 5 | 6 | 4 | 1 | 2 | 2 |
| 3 | 5 | 4 | 2 | 5 | 7 | 1 |
| 4 | 3 | 7 | 1 | 5 | 6 | 3 |
| 5 | 4 | 6 | 6 | 0 | 0 | 0 |
| 6 | 3 | 4 | 0 | 7 | 1 | 2 |
| 7 | 7 | 2 | 4 | 7 | 0 | 1 |

One can easily check for the provided codewords using [z p q r] in the equations to determine [x y z].

One can provide the solution set for any of 3 or less symbols in a codeword being in error.

One may also determine solutions for independent sets of unknowns by applying Cramer's rule. As an example, the set of equations for the above coder will be used. For application of Cramer's rule one should apply all additions and multiplications of this example in GF(8). When applying Cramer's rule using for other radix-n one should apply the appropriate arithmetic. In this example, one should apply addition and multiplication over $GF(2^3)$ of which the truth tables are provided above.

Assume that it is determined that x, y and z are in error. The codeword in error is [x y v z p q r]=[e1 e2 7 e4 5 6 3]. One should the create three equations with unknowns x1, x2 and x4 from the known equations as:

$$4x+y+2z=p+v$$

$$x+y+0=4p+q+2v$$

$$x+2y+0=p+4q+r$$

Cramer's rule then solves the above equations as:

$$x = \frac{\begin{vmatrix} d1 & 1 & 2 \\ d2 & 1 & 0 \\ d3 & 2 & 0 \end{vmatrix}}{D}$$

$$y = \frac{\begin{vmatrix} 4 & d1 & 2 \\ 1 & d2 & 0 \\ 1 & d3 & 0 \end{vmatrix}}{D}$$

$$z = \frac{\begin{vmatrix} 4 & 1 & d1 \\ 1 & 1 & d2 \\ 1 & 2 & d3 \end{vmatrix}}{D}$$

Herein $$D = \begin{vmatrix} 4 & 1 & 2 \\ 1 & 1 & 0 \\ 1 & 2 & 0 \end{vmatrix}$$

$$= 4*\begin{vmatrix} 1 & 0 \\ 2 & 0 \end{vmatrix} + 1*\begin{vmatrix} 1 & 0 \\ 1 & 0 \end{vmatrix} + 2*\begin{vmatrix} 1 & 1 \\ 1 & 2 \end{vmatrix}$$

$$= 0 + 0 + 2*(1+2)$$

$$= 2*4 = 5,$$

as the rules of GF(8) are used.

Furthermore, $$\begin{pmatrix} d1 \\ d2 \\ d3 \end{pmatrix} = \begin{pmatrix} p+v \\ 4p+q+2v \\ p+4q+r \end{pmatrix} = \begin{pmatrix} 4 \\ 6 \\ 0 \end{pmatrix}$$

Accordingly, $$x = \frac{2}{5} = 4; y = \frac{7}{5} = 3 \text{ and } z = \frac{5}{5} = 1.$$

Figure 9:
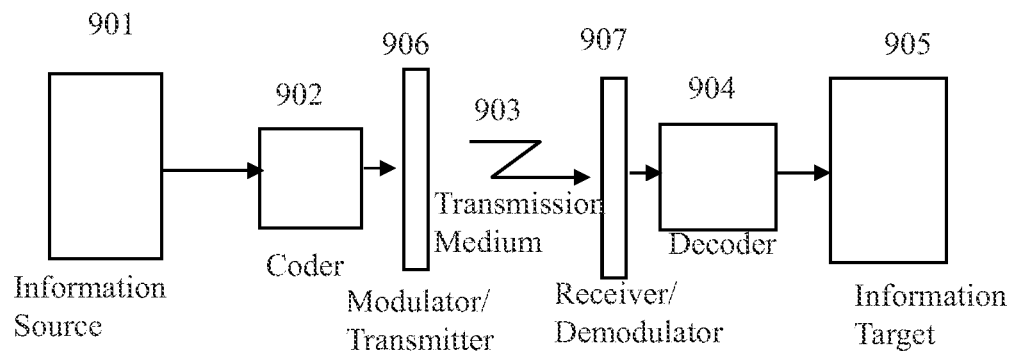
FIG. 9 illustrates a system that is used to perform the steps described herein in accordance with another aspect of the present invention.

This is in accordance with the elements in the word as generated by FIG. 9.

One may also apply Cramer's rule to other n-valued codes, such as the 5-valued coder of above. Herein, one should use the rules of modulo-5 addition and modulo-5 subtraction in the provided example, as well as the proper multiplication. Assuming that in a codeword [x1 x2 x3 p1 p2] the symbols x2, p1 and p2 are correct and x1 and x3 are in error the equations become:

$$x1+2x3=p1-x2$$

$$x1+0=p2-p1-2x2.$$

The determinant $D = \begin{vmatrix} 1 & 2 \\ 1 & 0 \end{vmatrix} = 1*0 - 2*1 = -2 = 3.$ The solution vector is $\begin{pmatrix} d1 \\ d2 \end{pmatrix} = \begin{pmatrix} p1-x2 \\ p2-p1-2x2 \end{pmatrix}.$ Assume that the codeword [x1 x2 x3 p1 p2]=[e1 4 e3 2 0] was received. According to Cramer's rule:

$$x1 = \frac{\begin{vmatrix} d1 & 2 \\ d2 & 0 \end{vmatrix}}{D} = \frac{\begin{vmatrix} 3 & 2 \\ 0 & 0 \end{vmatrix}}{3} = 0, \text{ and}$$

$$x3 = \frac{\begin{vmatrix} 1 & d1 \\ 1 & d2 \end{vmatrix}}{D} = \frac{\begin{vmatrix} 1 & 3 \\ 1 & 0 \end{vmatrix}}{3} = \frac{1*0 - 3*1}{3} = \frac{-3}{3} = -1 = 4.$$

Accordingly, the correct codeword is [x1 x2 x3 p1 p2]=[0 4 4 2 0]. It is thus demonstrated that as long as the position of errors are known one may correct any set of errors within the constraints of the number of independent equations.

For illustrative purposes errors are solved by using n-valued adders and multiplications, either modulo-n or over GF(n). An n-valued multiplication with a constant may be dealt with as an n-valued inverter. One may reduce combinations of n-valued inverters and an n-valued logic function to a function with a modified truth table as was shown by the inventor in U.S. patent application Ser. No. 10/935,960, filed on Sep. 8, 2004, which is incorporated herein by reference. An expression for a check symbol cs1=inv2(x1) sc5 inv3(x2) sc5 inv4(x3) may then be replaced by sc1=x1 sc51 x2 sc52, wherein sc51 and sc52 are the function sc5 modified in accordance with the inverters. This reduction may be applied to any expression having inverters and functions, including modulo-n adders and multipliers and adders and multipliers over GF(n). Accordingly, an n-valued expression created from adders and having at least one multiplier may be changed to an expression having at least one function not being an adder modulo-n or over GF(n). A function not being an adder over GF(n) or a modulo-n adder herein may be defined as an n-valued non-adder function.

In accordance with an aspect of the present invention, one may thus circumvent using an adder and multiplication by using an n-valued non-adder function in an expression to solve an error. Such an expression may be part of Cramer's rule.

Furthermore, one may overestimate the number of errors within the constraints. For instance, if only x1 was in error and x3 was not in error but the other conditions still apply then one still will reconstruct the correct value for x3. Even though x3 was not in error.

It is fairly simple to calculate the symbols in error 'on-the-fly', based on the errors. One can also already implement each set of solutions based on the maximum number of errors. Assuming 3 symbols in error even if only one is in error does not matter to the final error correction. One merely recalculates the symbols. The only limitation is that one of course can not solve in a deterministic way more errors than independent equations. One can again see the clear advantage here of knowing where the errors are located. It cuts the number of required check symbols in half, as compared to an RS code for instance.

FIG. 3 provides a diagram for solving different equations depending on different errors. One can store the equations for specific combinations of errors. As an example, it is assumed that at most 3 consecutive symbols can be in error. For each error combination a solution set is determined a stored for instance as an executable program or is hard wired as a circuit. Assume a codeword having 10 data symbols and 3 check symbols and each codeword of the set has at most 9 symbols in common with another codeword. Assume that, for instance, through using also horizontal error check symbols one can determine where errors occur in a column 1000 in FIG. 3. Assume that errors occurred in position 1001 or in the first 3 symbols of the codeword. The solution for this situation is enabled as 'solution 1' in equation solver 1010. This equation solver may be part of a computer program or hard wired logic circuits. The solver is then provided with the known correct symbols [x4 x5 x6 x7 x8 x9 x10 p1 p2 p3] and then generates the correct [x1 x2 x3].

Such a circuit or computer program may calculate a value. This may be achieved by n-valued or n-state circuits or devices. It may also be achieved by binary circuitry, wherein an n-state symbol is represented in binary form. Ultimately, the solver will generate the correct state for the symbols in error. The correct symbols may be generated as n-state signals, or in a binary signal representation or in any other signal representation that can be used to represent the corrected symbol. After error correction, a symbol in binary representation may for instance be converted into an n-state signal by applying a Digital/Analog converter as is well known to one of ordinary skill in the art. A symbol in binary representation may also be further processed in binary form. After error correction, the complete set of symbols as received and corrected is then available for further processing by digital devices or a processor or any other digital signal processing device. Accordingly, actual devices are used. One requires signals for further processing. For instance the received and corrected n-valued symbols may be processed an converted and provided by a device into an audio signal. It may also be used to generate a video signal, a radar signal, or any other useful signal. The methods and apparatus to correct n-valued signals or representations of n-valued or n-state signals are useful, as they prevent from errors to occur in for instance audio and/or video signals and thus prevent a negative experience by the user of such audio or video signals. In one embodiment an apparatus evaluates and/or processes at least 100 n-state check symbols per second. In another embodiment an apparatus evaluates and/or processes at least 1000 n-state check symbols per second. In yet another embodiment an apparatus evaluates and/or processes at least 100,000 n-state check symbols per second. In yet another embodiment an apparatus evaluates and/or processes at least one million n-state check symbols per second.

For another error situation 1002 the solver addresses a different 'solution 2' and generates [x5 x6 x7] and for error situation 1003 the solver addresses yet another 'solution 3' which may generate just x10 or also [p1 p2] if those symbols are used in a later stage.

Checking the Check Symbols

It has been shown that n-state symbols in error can be corrected once their location is known. In this section as an aspect of the present invention a method is provided to detect multiple errors over a dimension of a matrix and to provide possible locations of symbols in errors. Based on the location one may calculate directly the magnitude of an error (by using a syndrome) or the correct value of a symbol in error. When a dimension of a matrix (such as a row or a column) contains many data symbols of which only a few are in error it may reduce the number of calculations by first determining a magnitude of an error and then correct the symbol in error by that magnitude.

If a dimension of a matrix such as a row or a column has p check symbols of which each check symbol is generated of an independent equation compared to the other check symbols then always p symbols in error can be detected. Errors in such a case cannot cancel each other out. During coding the check symbols are calculated. The symbols are then processed, stored or transmitted. After receiving the processed, stored or transmitted symbols the check symbols are recalculated. The existence of one and up to p symbols in error in a dimension of a matrix will create at least one recalculated check symbol which is different from a received check symbol. The dimension such as a row or column of a matrix is then called in error, and may be called a row, column or dimension in error.

Because a data symbol in a matrix shares at least two dimensions such as a row and a column, an error in a data symbol will put at least two dimensions or for instance a row and column in error. Accordingly, an error may exist at the cross point of two dimensions in error.

Figure 4:
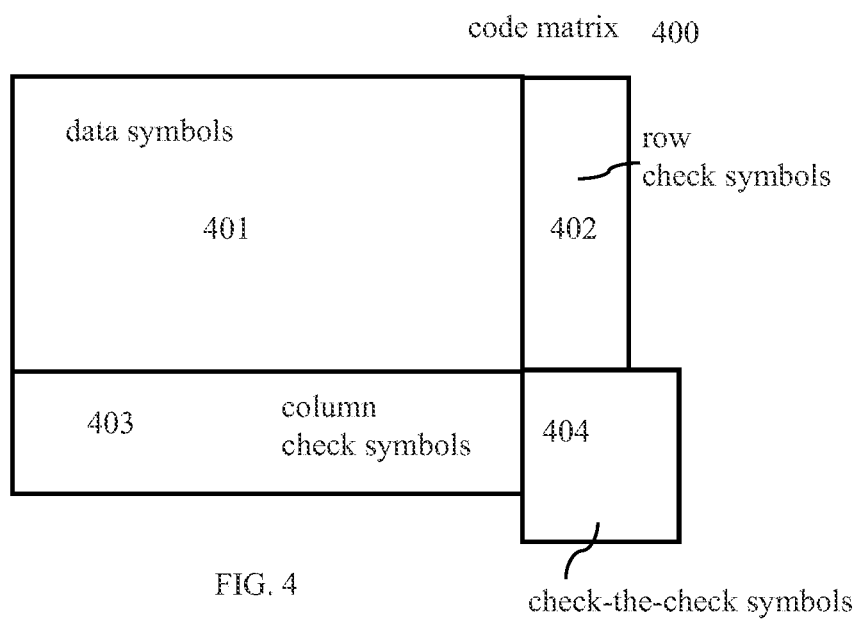
FIG. 4 is another diagram of a matrix in accordance with an aspect of the present invention.

In a dimension in error not only data symbols may be in error. Also check symbols may be in error. If only check symbols are in error one may not care to solve the symbols in errors as the data symbols are correct. If a mix of data symbols and check symbols are in error one may have to solve all errors. It may be advantageous to assure that all check symbols are error free, for instance by applying excess check-the check symbols 'tt' for instance by coding the check symbols according to a Reed Solomon (RS) code. Such use of a RS-code does not fundamentally change the approach herein provided. For illustrative purposes it is assumed that in one embodiment check symbols are error free, possibly by using RS codes. This is shown schematically in FIG. 4 in a matrix code 400. Herein the data symbols are in 401. The check symbols of the rows are in 402 and of the columns in 403. Check-the check symbols are in 404. The size of block 404 reflects that additional check on check-the check symbols are included to allow error correction in the check symbols. It is to be understood that in a different embodiment one may have errors in check symbols that require correction.

Locating and Correcting Errors in a Matrix

The problem of narrowing the location of errors in demonstrated in FIGS. 5 and 6 which show a matrix with errors related to the matrix code of FIG. 2. The check-the check symbols 'tt' are deliberately omitted in this illustrative example to keep focus on error location, but may be assumed.

The situation in FIG. 5 is simple. The shaded row related to check symbol t4 is in error. Also the shaded column related to p3, q3 and r3 is in error. Accordingly the symbol in error is on the crossing of this row and column: symbol z3 is in error. One may resolve the error by using one of the equations to determine the relevant check symbols as shown above.

The situation in FIG. 6 is more complicated. The shaded rows related to t2 and t4 are in error and the shaded columns related to p1 and p3 are in error. Even if it is assumed that only one error occurs in a row, this situation indicates that potentially symbols y1, y3, z1 and z3 are in error. One cannot resolve the errors over the rows in a deterministic way as each row has just one independent check symbol. However, one can resolve at least two independent equations per column. One may thus resolve y1 and z1 in the first column. In case just one symbol is in error one will find one symbol to be changed as to its received value and one symbol being the same as to its received value. The same applies to the column with y3 and z3.

One can see in FIG. 6 that two columns are in error, even though the error limitation of one error per row was not exceeded. However, the limitation of 3 rows in error was not exceeded. One may thus derive a rule for deterministic error detection and correction in a matrix code.

A row of a matrix comprising n-state data symbols may have p independent n-state check symbols. A column of the matrix comprising n-state data symbols may have q independent check symbols. If m columns are in error with m>p but not more than q rows are in error one can solve up to m×q symbols in error by assuming each symbol that is in a row or a column in error as an unknown; by solving q unknowns in a column from a set of q independent equations; and by solving all unknowns for all columns.

One may interchange the terms column and rows for the situation wherein m rows are in error with m>q but no more than q columns are in error.

One may also adapt the rule for k-dimensional matrices with k≥2. A first dimension of a k-dimensional matrix comprising n-state data symbols may have p independent n-state check symbols. A second dimension of the k-dimensional matrix comprising n-state data symbols may have q independent check symbols. If m instances of the first dimension are in error with m>p but not more than q instances of the second dimension are in error one can solve up to m×q symbols in error by assuming each symbol that is in an instance of a first and a second dimension in error as an unknown; by solving q unknowns in an instance of second dimension from a set of q independent equations; and by solving all unknowns for all instances of a second dimension.

An instance of a dimension is then a row in that dimension. An instance of a first dimension in a 2-dimensional matrix may be a row in horizontal direction, commonly called a row. An instance of a second dimension of a 2-dimensional matrix is then a row in the vertical direction or commonly called a column. An instance of a third dimension of a 3-dimensional matrix is a row that is perpendicular to the first and second dimensions, etc.

One may further code and decode a plurality of n-state data symbols by associating the data symbols with a first matrix. One may then generate check symbols over instances of a dimension (a row for instance). In order to enable decoding the data symbols and check symbols are then associated with a second matrix. It should be clear that the second matrix has more dimensions that the first matrix. Furthermore, one may create Reed Solomon codewords for the check symbols by creating check symbols for the check symbols (check-the check symbols).

While one may solve errors by using the symbols in errors as unknowns one may also solve the magnitude of an error by using syndromes.

As described above and by the inventor in U.S. patent application Ser. No. 11/680,719 filed Mar. 1, 2007 and in Ser. No. 11/739,189 filed Apr. 24, 2007 and in U.S. patent application Ser. No. 11/969,560 filed on Jan. 4, 2008, which are all incorporated herein by reference, one may create n-state check symbols by executing the n-state expression: s11→a*x1+b*x2+c*x3+d*x4 wherein + is an n-valued adder (be it mod-n or over GF(n)) and * is an n-valued multiplication. If one wants to solve the equation for unknowns the multiplication must be a reversible function. This means that the multiplication could be defined in the extension field $GF(n=2^p)$ if n is a multiple of 2.

It was also shown earlier that an n-valued constant multiplier applied to an n-state variable may be treated as an n-valued inverter. Accordingly one may write the equation for s11 as:

s11→$inv_a$(x1) sc1 $inv_b$(x2) sc2 $inv_c$(x3) sc3 $inv_d$(x4). Herein $inv_a$(x1) means that x1 is modified according to an inverter $inv_a$ which is n-valued multiplication by a factor 'a'.

It was shown by the inventor in U.S. Non-Provisional patent application Ser. No. 10/935,960, filed on Sep. 8, 2004 which is incorporated herein by reference how a function with inputs containing an inverter can be reduced to a function having no inverter. According to this aspect one could write s11 for instance as: s11→(((x1 $sc_m$1 x2) $sc_m$2 x3) $sc_m$3 x4). Herein a function $sc_m$ is an n-valued function modified according to one or more inverters. For illustrative purposes functions over $GF(2^p)$ will be used, as this make manipulation of expressions easier. However, other n-state functions are possible and are fully contemplated. Adders over $GF(2^p)$ are associative, distributive and self reversing. As was shown above, solving equations can easily be achieved with for instance Cramer's rule. Because Cramer's rule will lead to adding of terms which are multiplied by a coefficient, one may in implementation reduce these functions again according to the inverters which represent the multipliers, to reduced functions not being an addition and not having multipliers, thus making execution of an n-valued expression faster.

It was also shown that in n-valued or n-state logic one may create from the same n-valued symbols two different and independent equations to generate a check symbol. For instance: s11→a1*x1+b1*x2+c1*x3+d1*x4 s12→a2*x1+b2*x2+c2*x3+d2*x4

The above, and other n-state switching expressions provided herein, may look like arithmetical expressions. It is emphasized that these expressions are n-state switching or logic expressions that are to be implemented in devices.

One can thus create a codeword [x1 x2 x3 x4 s11 s12] which may be part of a code wherein each codeword differs at least in 3 symbols in like positions. This means that in such a code two errors can be detected in each codeword (without determining a location) by recalculating the check symbols. These errors may include errors in the check symbols. Codewords with such a property can be generated by LFSRs, but also by direct execution of the expressions as shown above. If one uses an LFSR such an LFSR may be in Galois or Fibonacci configuration. In general Galois configuration LFSRs are used in the literature, however this is not required and Fibonacci configurations may have a speed advantage as one may start generating check symbols directly. A Galois LFSR needs to read-in each symbol to generate the correct content of the shift register and then needs to read-out the generated symbols. LFSR methods are for instance used in CRC error detection. By using this type of codewords errors in case of two errors in a codeword cannot be hidden by canceling each other out under certain conditions.

For illustrative purposes the number of errors will not exceed 3 in a word. One may use a 4-valued or higher valued code to achieve the required number of independent equations to generate n-valued check symbols. While the selection of n does not affect the number of errors that can be detected with 100% certainty, it does affect the chance of hiding additional errors. Assume that a codeword has 5 n-valued symbols of which 2 are check symbols generated by independent equations. Assume further that 2 symbols are in error and can be detected. The chance that a third error in one of the other symbols will create a correct codeword is smaller as n becomes greater and the chance that an additional error is hiding becomes smaller.

For instance one may generate two 4-valued check symbols s1 and s2 by the following equations:

$$s1=x1+x2+x3; \text{ and}$$

$$s2=x1+2*x2+3*x3,$$

wherein + and * are defined in GF(4).

There are 64 4-valued codewords [x1 x2 x3 s1 s2]. Assume 2 errors: e1 and e2 in the codeword for instance as: [e1 x2 e3 s1 s2].

In accordance with an aspect of the present invention a value of n is selected for creating codewords that will detect at least p errors and that increases the chance to detect p+1 errors.

As an example apply the 4-valued codeword [x1 x2 x3 s1 s2]=[0 0 3 3 2], wherein check symbols s1=3 and s2=2 are generated by the earlier provided independent expressions. Assume that symbols x2 and s2 are received correctly. This means that errors in x1, x3 and s1 must occur in such a way that a correct codeword will be formed. The correct codewords in this set of codewords with x2=0 and s2=2 are:
[1 0 1 0 2];
[2 0 0 2 2]; and
[3 0 2 1 2].

For an 8-valued code one may apply the expressions:

$$s1=x1+x2+x3; \text{ and}$$

$$s2=x1+2*x2+7*x3,$$

wherein + and * are defined over GF(8).

Assume an 8-valued codeword [x1 x2 x3 s1 s2]=[1 7 4 6 3] wherein check symbols s1=6 and s2=3 are generated by the provided independent 8-valued expressions. Assume that symbols x2 and s2 are received correctly. This means that errors in x1, x3 and s1 must occur in such a way that a correct codeword will be formed. The correct codewords in this set of codewords with x2=7 and s2=3 are:
[0 7 1 3 3];
[2 7 7 2 3];
[3 7 2 4 3];
[4 7 6 1 3];
[5 7 5 7 3];
[6 7 3 5 3]; and
[7 7 0 0 3].

Accordingly it is less likely for an 8-valued codeword with 3 symbols in errors to generate a correct codeword than it is for errors in a 4-valued codeword to do the same. However it is probably fair to say that that for higher values of n it already is fairly unlikely to generate a correct codeword from errors.

This means that most likely an n-valued codeword with p check symbols over a first dimension with k n-valued symbols generated by p independent equations but with m instances of a second dimension in error with k>p, but wherein a second dimension with q check symbols over a second dimension has not more instances of the first dimension in error than p, one is likely able to solve q×m>p×q errors.

Assume the three check symbols over a data symbols [x1 x2 x3 x4] are determined by three independent n-valued expressions:

$$a1*x1+a2*x2+a3*x3+a4*x4=s1;$$

$$b1*x1+b2*x2+b3*x3+b4*x4=s2; \text{ and}$$

$$c1*x1+c2*x2+c3*x3+c4*x4=s3.$$

For illustrative purposes assume '+' to be an addition over GF(8) and '*' be a multiplication over GF(8). Check symbols may be generated by either executing the above expressions by 8-valued switching functions, or by running an LFSR that will generate [r1 r2 r3], or by executing three 8-valued expressions in a 8-state switching device which are equivalent to the above expressions. It has been shown by the inventor in the earlier cited patent applications that expressions containing a multiplication by a constant and an addition may be reduced to a function not being an addition and containing not a multiplication. Such an equivalent expression may determine a check symbol faster than an expression containing an multiplication. It may be easier to first determine all expressions with multiplications and additions because in GF(8) these functions are commutative, associative and distributive, and reduce the obtained final expressions.

For solving the errors in a matrix wherein the number of potential errors is significantly smaller than the number of data symbols, it may be easier to apply syndrome calculations. In the above example one may assume that any of the five symbols in the first row can be in error. It is also assumed that the check symbols are known to be error free. One may also use the methods disclosed herein for check symbols that are not error free. However one then has to solve the equations for solving errors in check symbols, as in that case no fundamental difference can be made between data symbols and check symbols.

FIG. 7 shows a matrix code with 3 independent check symbols per column and per row. An error situation is shown in FIG. 7. After recalculation of check symbols it is clear that errors have occurred in rows 1, 2 and 5; and it is clear that errors have occurred in columns 1, 2, 3 and 4. Assume that the code is dimensioned in such a way that "illegal" errors which are more than 3 errors in a row or in a column have not occurred. In fact an error 'eij' is an assumed error, not an actual error. The actual errors are indicated as 'aeij' and are printed in bold and a larger font in FIG. 7. The positions of the actual errors are of course unknown a priori solving the errors. However the total assumed number of errors can all be resolved using the independent n-valued expressions.

Assuming that the check symbols are error free, one may then determine:

$$a1*(x1+e11)+a2*(x2+e12)+a3*(x3+e13)+a4*(x4+e14)=(s11+se11);$$

$$b1*(x1+e11)+b2*(x2+e12)+b3*(x3+e13)+b4*(x4+e14)=(s12+se12); \text{ and}$$

$$c1*(x1+e11)+c2*(x2+e12)+c3*(x3+e13)+c4*(x4+e14)=(s13+se13).$$

Herein (x1+e11), (x2+e12), and (x1+e13) are the received values of the data symbols for the position of x1, x2 and x3. It may be assumed that the "error-free" value of a symbol was changed during transmission by a value 'e'. By inputting these received values in the expressions one can determine the calculated check symbol values. These calculated check value symbols may differ from the received check value symbols by a factor 'seij'. It was assumed that the received check symbols are error free (or can be made error free by applying a Reed Solomon code, using check symbols over check symbols). Accordingly one can determine what a difference between calculated and received data symbols is.

Because of the properties of the multiplication and addition function one may reduce the above expressions to the syndrome equations:

$$a1*e11+a2*e12+a3*e13+a4*e14=se11;$$

$$b1*e11+b2*e12+b3*e13+b4*e14=se12; \text{ and}$$

$$c1*e11+c2*e12+c3*e13+c4*e14=se13.$$

Because of the spreading of the errors over all column positions, it is not possible to solve these column equations, as there are 4 unknowns and 3 equations. It should pointed out that if the error 'ae11' in FIG. 7 had not occurred one would be able to solve directly the syndrome equations for e11, e12 and e13 and create the correct value of x1, x2 and x3 by adding over GF(8) the value of the error to the received value. This is because e11+e11=0 over GF(8) and thus (x1+e11)+e11=x1+(e11+e11)=x1+0=x1.

However, one can also see from FIG. 7 that each column only will have 3 assumed syndrome errors (of which some will be 0), and these can be calculated directly by solving the set of equations for the syndromes, for instance by applying Cramer's rule.

A worked out 8-valued example will be provided next. Assume that the three check symbols over a row of 8-valued data symbols, as shown in FIG. 8 will be provided by the 8-valued expressions:

$$x1+x2+x3+x4=s1;$$

$$x1+2*x2+5*x3+2*x4=s2; \text{ and}$$

$$x1+3*x2+4*x3+7*x4=s3.$$

Herein x1, x2, x3, and x4 are the consecutive data symbols in a row and the codeword formed by a matrix row is then [x1 x2 x3 x4 s1 s2 s3].

A similar approach can be applied to generating check symbols r1, r2 and r3 over each column of data symbols. To make a difference between data symbols ordered in a row or a column the column symbols will be designated as 'yi'. The generating 8-valued expressions over GF(8) are then:

$$y1+y2+y3+y4+y5=r1;$$

$$y1+2*y2+3*y3+4*y4+5*y5=r2; \text{ and}$$

$$y1+5*y2+7*y3+2*y4+3*y5=r3.$$

Please note that in the example a column has 5 data symbols and a row has 4 data symbols. Each row and each column have one symbol in common. It is assumed in FIGS. 7 and 8 for illustrative purposes that the check symbols are error free. Check symbols to check the check symbols may be assumed but are not shown and may be part of an RS code for check symbols.

The following matrix shows the received symbols of which some may be in error and the correct check symbols as calculated before being transmitted (d is a data symbol, c indicates a check symbol).

| d | d | d | d | d | c | c | c |
|---|---|---|---|---|---|---|---|
| d | 1 | 2 | 3 | 0 | 0 | 0 | 0 |
| d | 1 | 2 | 3 | 4 | 0 | 6 | 4 |
| d | 3 | 3 | 3 | 3 | 0 | 1 | 6 |
| d | 5 | 5 | 5 | 5 | 0 | 3 | 1 |
| d | 7 | 7 | 2 | 3 | 0 | 5 | 3 |
| c | 5 | 5 | 5 | 5 |   |   |   |
| c | 5 | 5 | 5 | 5 |   |   |   |
| c | 1 | 1 | 1 | 1 |   |   |   |

A similar matrix, but now with the re-calculated check symbols will generate:

| d | d | d | d | d | c | c | c |
|---|---|---|---|---|---|---|---|
| d | 1 | 2 | 3 | 0 | 6 | 0 | 7 |
| d | 1 | 2 | 3 | 4 | 3 | 5 | 1 |
| d | 3 | 3 | 3 | 3 | 0 | 1 | 6 |
| d | 5 | 5 | 5 | 5 | 0 | 3 | 1 |
| d | 7 | 7 | 2 | 3 | 5 | 0 | 4 |
| c | 6 | 6 | 0 | 7 |   |   |   |
| c | 6 | 2 | 6 | 3 |   |   |   |
| c | 0 | 2 | 6 | 2 |   |   |   |

Comparing the difference in check symbols one may conclude that rows 1, 2 and 5 and all columns are in error. Accordingly one may solve errors over the columns. The first column with correct check symbols is [1 1 3 5 7 5 5 1]. Symbols 1, 2 and 5 may be assumed in error as [e1 e2 e3]. The syndrome is [(6+5) (6+5) (0+1)] which is achieved by adding GF(8) the re-calculated and the correct check symbol and provides [1 1 1].

The syndrome equations are:

$$e1+e2+e3=1;$$

$$e1+2*e2+5*e3=1; \text{ and}$$

$$e1+5*e2+3*y5=1.$$

As shown before one can for instance calculate [e1 e2 e5] by applying Cramer's rule. This will provide e1=1, e2=0 and e3=0. This means that y1=1+e1=1+1=0; y2=1+0=1; and y5=7+0=7.

One may apply this method to all columns, solve the errors and determine the true value of the data symbols.

One may also solve the second column next. This is shown in the following matrix with 'correct' check symbols.

| d | d | d | d | d | c | c | c |
|---|---|---|---|---|---|---|---|
| d | 0 | 0 | 3 | 0 | 0 | 0 | 0 |
| d | 1 | 1 | 3 | 4 | 0 | 6 | 4 |
| d | 3 | 3 | 3 | 3 | 0 | 1 | 6 |
| d | 5 | 5 | 5 | 5 | 0 | 3 | 1 |
| d | 7 | 7 | 2 | 3 | 0 | 5 | 3 |
| c | 5 | 5 | 5 | 5 |   |   |   |
| c | 5 | 5 | 5 | 5 |   |   |   |
| c | 1 | 1 | 1 | 1 |   |   |   |

The matrix with re-calculated check symbols is provided in the following matrix.

| d | d | d | d | d | c | c | c |
|---|---|---|---|---|---|---|---|
| d | 0 | 0 | 3 | 0 | 3 | 7 | 6 |
| d | 1 | 1 | 3 | 4 | 6 | 0 | 5 |
| d | 3 | 3 | 3 | 3 | 0 | 1 | 6 |
| d | 5 | 5 | 5 | 5 | 0 | 3 | 1 |
| d | 7 | 7 | 2 | 3 | 5 | 0 | 4 |
| c | 5 | 5 | 0 | 7 |   |   |   |
| c | 5 | 5 | 6 | 3 |   |   |   |
| c | 1 | 1 | 6 | 2 |   |   |   |

By comparing the two matrices one can tell that still rows 1, 2 and 5 are in error but now only column 3 and 4 are in error. One may make a decision to solve the errors over either the columns or over the rows. The rows each have two unknowns, while the columns each have 3 unknowns. While it does not make a big difference in this case, in other cases it may make a difference in computing time which approach one takes. Accordingly, in accordance with an aspect of the present invention it is determined if a column or a row has the fewest number of unknowns. Based on this determination, the errors in the column or row with the lowest number of errors are solved.

As an aspect of the present invention thus a method has been provided for error correcting coding and decoding of n-valued symbols in a matrix that has at least 2 dimensions, and wherein over a first dimension (for instance the rows) k independent check symbols are developed and over a second dimension (for instance the columns) p independent check symbols are developed. One may provide check symbols over check symbols to make sure that after reception the check symbols are error free. As long as the errors in a row do not exceed k and the number of rows with errors does not exceed p, one may be able to correct all errors.

One may exchange the role of columns and rows as an aspect of the present invention, wherein then the columns are assumed to have a maximum number of errors that will not be exceeded and wherein the check symbols over the rows will be used to solve errors in the columns.

In reasonable error conditions such a code may have better performance than for instance a Reed Solomon product code. It can solve errors fairly easily, by virtue of simple error location detection and simple calculation of error magnitude. If not too many errors occur one can use fewer check symbols than a word coded in RS mode, which of course applies twice as many check symbols. The advantage of the RS code is that if the condition of sufficient independent check symbols (assume 2*b) is met one may solve the maximum number of errors (b) for each codeword.

It should be clear that the method of error correction can error correct at least pxq symbols if one dimension of the matrix each instance has p check symbols and each instance of the second dimension has q check symbols. In many cases 's' n-valued check symbols generated by independent sets of equations will detect more than 's' errors. Assume that in a row of data symbols p symbols in error may always be detected. Assume that up to q symbols in error will be detected in a column. Assume that each row has p errors, but there will not be overlap between errors in different rows. One then has to solve pxqxq unknowns of which pxq are errors. However one can easily imagine that the other unknowns are also errors, which have been detected. In that case one may solve up to pxqxq errors in a deterministic way.

The coding/decoding method provided above has of course limitations in the number of errors that can be corrected. It is assumed that a dimension has no more errors than can be detected. Such a limitation may be reasonable for instance over the rows, if the sequence of symbols is transmitted as sub-sequent rows. However such a limitation is a disadvantage to the column structure of the matrix. For instance assume an 8 by 8 matrix of data symbols, wherein each row and column is provided with three independently generated check symbols. Assume that at most 3 symbols in error can occur in a row. The following matrix shows an example of how one may still correct errors when more than 3 rows are in error.

| e | e | e |   |   |   |   | ▦ | ▦ | ▦ |
|---|---|---|---|---|---|---|---|---|---|
| e | e | e |   |   |   |   |   | ▦ | ▦ |
|   |   |   |   |   |   |   |   | ▦ | ▦ |
| e | e | e |   |   |   |   |   | ▦ | ▦ |
|   |   |   |   |   |   |   |   | ▦ | ▦ |
| e | e | e |   |   |   |   |   | ▦ | ▦ |
|   |   |   |   |   |   |   |   | ▦ | ▦ |
| e | e | e |   |   |   |   |   | ▦ | ▦ |
| ▦ | ▦ | ▦ |   |   |   |   |   |   |   |
| ▦ | ▦ | ▦ |   |   |   |   |   |   |   |
| ▦ | ▦ | ▦ |   |   |   |   |   |   |   |

Assume that the check symbols are error free. Symbols in error are shown as 'e'. The grey cells indicate that rows or columns contain errors. In the above example each row has no more than 3 errors. However 5 rows are in error. Fortunately all errors are aligned in the same three columns. Though errors may cancel each other out, it is likely that for 8-valued symbols the columns in errors may still be identified correctly. In that case one can of course easily correct the errors.

The following matrix shows how both in a column or a row not more than 3 errors occur.

| e | e | e |   |   |   |   |   | ▦ | ▦ | ▦ |
|---|---|---|---|---|---|---|---|---|---|---|
|   | e | e | e |   |   |   |   |   | ▦ | ▦ |
|   |   |   |   |   |   |   |   |   | ▦ | ▦ |
|   |   | e | e | e |   |   |   |   | ▦ | ▦ |
|   |   |   |   |   |   |   |   |   | ▦ | ▦ |
|   |   |   | e | e | e |   |   |   | ▦ | ▦ |
|   |   |   |   |   |   |   |   |   | ▦ | ▦ |
|   |   |   |   | e | e | e |   |   | ▦ | ▦ |
| ▦ | ▦ | ▦ |   |   |   |   |   |   |   |   |
| ▦ | ▦ | ▦ |   |   |   |   |   |   |   |   |
| ▦ | ▦ | ▦ |   |   |   |   |   |   |   |   |

Errors occur in overlapping positions. One could provide more check symbols per column to address this issue. This would actually be a good deal, as each additional check symbol would enable correcting an additional error in a column.

As will be shown one may also solve errors by making assumptions. The assumptions for illustrative purposes will be quite limiting, making quasi deterministic solutions possible. After demonstrating how to address the assumptions and constraints it should be clear that one can make much more relaxed assumptions, enabling to go through different more or less likely solutions. Like in solving LDPC codes one may create a more probabilistic iterative error correcting approach. For solving the errors one needs to establish the generating equations for the check symbols. This is a novel approach, as most known LFSR based methods work with generating polynomials over GF, rather than their generating n-valued equation.

If one has just barely exceeded the conditions for deterministic solving of errors one may try to solve one row or column by "guessing" or running through all possibilities. Just solving by "guessing" of a limited number of errors may change the error tableau in such a way that next one may solve the remaining errors in a deterministic way.

One assumption may be that at most 3 consecutive errors will ever occur. That means that if more rows are in error than consecutive errors can occur, then there is only partial overlap of errors in rows. In that case also not all rows have overlap. One may then solve the errors by making some further assumptions. For instance in the above error situation one may start with the assumption that in some cases the first 3 rows in errors do not overlap the bottom two rows in error and solve the equations based in error for 3 columns. For each 3 columns one may solve the errors in a column and recalculate the errors in rows and columns.

For instance the above error tableau has the situation:

Columns 1, 2, 3, 4, 5, 6 and 7 are in error; so are rows 1, 2, 4, 6 and 8. The number of rows in error is greater than the maximum number of errors per row. Accordingly there may be assumed a limited overlap of errors. Assume first that only rows 1, 2 and 4 are in error and rows 6 and 8 are not. In a next step solve errors for the first reach of columns in error, columns 1, 2 and 3.

|   | 1 | 2 | 3 | 4 | 5 | 6 | 7 | 8 |   |   |   |
|---|---|---|---|---|---|---|---|---|---|---|---|
| 1 | e | e | e |   |   |   |   |   |   |   |   |
| 2 |   | e | e | e |   |   |   |   |   |   |   |
| 3 |   |   |   |   |   |   |   |   |   |   |   |
| 4 |   |   | e | e | e |   |   |   |   |   |   |
| 5 |   |   |   |   |   |   |   |   |   |   |   |
| 6 |   |   |   | e | e | e |   |   |   |   |   |
| 7 |   |   |   |   |   |   |   |   |   |   |   |
| 8 |   |   |   |   | e | e | e |   |   |   |   |
|   |   |   |   |   |   |   |   |   |   |   |   |
|   |   |   |   |   |   |   |   |   |   |   |   |
|   |   |   |   |   |   |   |   |   |   |   |   |

When one solves the errors and recalculate the check symbols the following error tableau will occur:

|   | 1 | 2 | 3 | 4 | 5 | 6 | 7 | 8 |   |   |   |
|---|---|---|---|---|---|---|---|---|---|---|---|
| 1 | s | s | s |   |   |   |   |   |   |   |   |
| 2 |   | s | s | e |   |   |   |   |   |   |   |
| 3 |   |   |   |   |   |   |   |   |   |   |   |
| 4 |   |   | s | e | e |   |   |   |   |   |   |
| 5 |   |   |   |   |   |   |   |   |   |   |   |
| 6 |   |   |   | e | e | e |   |   |   |   |   |
| 7 |   |   |   |   |   |   |   |   |   |   |   |
| 8 |   |   |   |   | e | e | e |   |   |   |   |
|   |   |   |   |   |   |   |   |   |   |   |   |
|   |   |   |   |   |   |   |   |   |   |   |   |
|   |   |   |   |   |   |   |   |   |   |   |   |

The solved errors will be named s. Recalculating the check symbols over columns is unreliable, because of the assumption. However recalculation of check symbols over a row will show if one has caught all errors in a row. Accordingly, based on the assumption, one will have cleared the errors in the first rows and one may replace the received symbols with the recalculated symbols. Row 2 will remain in error because column 4 will remain in error. The same reasoning applies to row 4. One may then fill in the correct values for the errors in row 1, and recalculating the check symbols will create the following tableau:

|   | 1 | 2 | 3 | 4 | 5 | 6 | 7 | 8 |   |   |   |
|---|---|---|---|---|---|---|---|---|---|---|---|
| 1 |   |   |   |   |   |   |   |   |   |   |   |
| 2 |   | s | s | e |   |   |   |   |   |   |   |
| 3 |   |   |   |   |   |   |   |   |   |   |   |
| 4 |   |   | s | e | e |   |   |   |   |   |   |
| 5 |   |   |   |   |   |   |   |   |   |   |   |
| 6 |   |   |   | e | e | e |   |   |   |   |   |
| 7 |   |   |   |   |   |   |   |   |   |   |   |
| 8 |   |   |   |   | e | e | e |   |   |   |   |
|   |   |   |   |   |   |   |   |   |   |   |   |
|   |   |   |   |   |   |   |   |   |   |   |   |
|   |   |   |   |   |   |   |   |   |   |   |   |

One may make the next assumption rows 2, 4 and 6 being in error, as well as columns 2, 3 and 4. Most likely columns 2 and 3 may also be assumed to be error free due to the previous step. Solving the errors and computing the correct value allows comparison with the previous step to confirm the correct solution. This will lead to the following tableau:

|   | 1 | 2 | 3 | 4 | 5 | 6 | 7 | 8 |   |   |   |
|---|---|---|---|---|---|---|---|---|---|---|---|
| 1 |   |   |   |   |   |   |   |   |   |   |   |
| 2 |   |   |   |   |   |   |   |   |   |   |   |
| 3 |   |   |   |   |   |   |   |   |   |   |   |
| 4 |   |   | s | s | e |   |   |   |   |   |   |
| 5 |   |   |   |   |   |   |   |   |   |   |   |
| 6 |   |   |   |   | s | e | e |   |   |   |   |
| 7 |   |   |   |   |   |   |   |   |   |   |   |
| 8 |   |   |   |   |   | e | e | e |   |   |   |
|   |   |   |   |   |   |   |   |   |   |   |   |
|   |   |   |   |   |   |   |   |   |   |   |   |
|   |   |   |   |   |   |   |   |   |   |   |   |

The above tableau now allows for solving the remaining errors.

The iterative method as provided above can also be used wherein the role of columns and rows are exchanged.

It should be clear that the successful execution of the above iterations depends on making the right assumptions. Accordingly, it would be beneficial to have several assumptions available to calculate "assumed" errors. In accordance with another aspect of the present invention one implements on a processor several 'assumption trees' of possible errors situations and pursue the ones that clear (in this case) the row errors. One may also implement and/or execute each tree in a separate processor, thus enabling the processing of each tree in parallel. One may then execute each 'tree' and check if such a tree provides a solution. One may then select the solution of a tree that provides a clear and unambiguous solution. For instance the assumption that rows 1 and row 8 are error free for most of the columns will not clear the check symbols of the rows.

It should be clear that while in the above examples the check symbols are designed to be error free, this is not a necessary requirement for the herein provided error correcting methods to work. One may apply these methods also when check symbols can be in error. However in that case one may have to solve error situations wherein errors and solved errors are check symbols. Such methods are fully contemplated as an aspect of the present invention.

Furthermore, to solve errors, the syndromes are used to calculate the magnitude of the error and then calculate the correct value of the symbol in error. When it is known which symbols are in error and what the correct value of a check symbol is, one may also directly solve the value of a symbol in error. However in general this requires solving more equations and may take more time. There may be situations wherein solving more equations but not having to calculate the correct value from a symbol in error and an error magnitude is actually faster and such situations are fully contemplated as an aspect of the present invention.

As was shown above, one may create a matrix of 2 or more dimensions, with at least k columns and m rows of n-state data symbols, wherein each row has p check symbols, each check symbol being generated by applying one of p independent n-state expressions with the symbols in the row as variables, and each column has at least q check symbols, each of those check symbols being determined from m n-state data symbols in a column by using one of q independent n-state expressions with the m n-state data symbols as variables.

One may have several situations: p=q, p<q or q<p. In case p=q or q<p then the maximum number of unknowns that can be resolved in a matrix containing the data symbols and check symbols are at most $p^2$ data symbols in error. One would probably prefer to solve the equations with the fewest number of unknowns. However a p by p set of unknowns requires (at least initially) that the rows with p unknowns to be resolved. Once, one has resolved enough rows so that q rows with unknowns are left, one may proceed with solving equations with up to q unknowns determined by columns. It should be clear that the roles of columns and rows can be switched and q>p or that a column has more check symbols than a row. In that case up to $q^2$ unknowns can be resolved.

Reduced Row-Echelon Form Solution

In a number of the cases wherein one may have for instance more rows in error than check symbols one may still have enough independent equations to solve the errors from the known syndromes. In such case the solutions may be overdetermined. One may be able to solve the equations by using the known Reduced Row-Echelon method, also known as the Gauss or Gauss-Jordan Echelon method. Herein, one reduces the matrix with the syndrome equations to the form wherein each row has just one independent solution. This approach is known and is for instance implemented in the mathematical software program Matlab as the instruction "rref(A)", wherein A is the unreduced matrix with all equations. In general the Matlab instruction rref(A) applies common 10-valued arithmetic to all elements of the matrix to wipe the columns. It should be clear that one can adapt such a method to for instance modulo-10 arithmetic. One may adapt the rules also to any other arithmetic over GF(n), which is fully contemplated as an aspect of the present invention. One may also adapt the rule and implement it for error correction for any modulo-n or GF(n) arithmetic.

As an illustrative example the normal decimal instruction rref(A) in Matlab will be applied, with the understanding that the method can be adapted to any n-valued logic. The purpose is to show that in a number of cases a sufficient number of independent equations is available to solve the errors.

For instance assume the following 10-valued code matrix:

|   | 1 | 2 | 3 | 4 | 5 | r1 | r2 |
|---|---|---|---|---|---|----|----|
| 1 |   |   |   |   |   |    |    |
| 2 |   |   |   |   |   |    |    |
| 3 |   |   |   |   |   |    |    |
| 4 |   |   |   |   |   |    |    |
| 5 |   |   |   |   |   |    |    |
| q1|   |   |   |   |   |    |    |
| q2|   |   |   |   |   |    |    |

In this code 25 10-valued data symbols are ordered in a 5 by 5 matrix. Each row and each column has two check symbols: r1 and r2 to each row and q1 and q2 to each column. The first check symbol of each row and each column is determined by r1=x1+x2+x3+x4+x5. Herein, + (for illustrative purposes) is the normal addition. This means that r1 can be multi-digit. In the GF(n) case the '+' is a logic function which can be an addition over GF(n) such as modulo-n add if appropriate. In that case the check symbol will be a single symbol. As was shown above one can solve an equation for such a case.

The second symbol in this example is created by r2=x1+ 2×2+5×3+6×4+8×5. These equations apply to check symbols in columns as well as rows in the matrix. One can then calculate the check symbols for a specific set of data symbols. One can assure that all check symbols are error free, for instance by using a Reed Solomon code for the check symbols. As was explained before, one may also solve any error in a column or a row if one does not assure error free check symbols. This makes the code less efficient because one may have to solve non data symbol errors. However, this does not fundamentally change the approach.

Assume a following syndrome matrix, based on error free check symbols:

|    | 1  | 2  | 3 | 4 | 5 | r1 | r2 |
|----|----|----|---|---|---|----|----|
| 1  | e1 | e2 |   |   |   | 2  | 3  |
| 2  | e3 | e4 |   |   |   | 2  | 3  |
| 3  | e5 | e6 |   |   |   | 2  | 3  |
| 4  |    |    |   |   |   |    |    |
| 5  |    |    |   |   |   |    |    |
| q1 | 3  | 3  |   |   |   |    |    |
| q2 | 8  | 8  |   |   |   |    |    |

From the syndromes it is clear that errors may have occurred in rows 1, 2 and 3 in columns 1 and 2. Potential errors can be e1, e2, e3, e4, e5 and e6. This exceeds the capabilities to solve the columns (as each column only has 2 equations but potentially 3 unknowns). One may solve of course the rows, as each row has two equations and two unknowns. One may also conclude that in total 6 unknowns may be present with 10 equations. Accordingly, the system of unknowns may be over-determined and can be solved by using Gauss-Jordan.

One can translate the above matrix to a matrix R wherein each row represents an equation with unknowns e1, e2, e3, e4, e5 and e6. The matrix is shown in the following table:

| e1 | e2 | e3 | e4 | e5 | e6 | check symbol |
|----|----|----|----|----|----|--------------|
| 1  | 1  | 0  | 0  | 0  | 0  | 2            |
| 1  | 2  | 0  | 0  | 0  | 0  | 3            |
| 0  | 0  | 1  | 1  | 0  | 0  | 2            |
| 0  | 0  | 1  | 2  | 0  | 0  | 3            |
| 0  | 0  | 0  | 0  | 1  | 1  | 2            |
| 0  | 0  | 0  | 0  | 1  | 2  | 3            |
| 1  | 0  | 1  | 0  | 1  | 0  | 3            |
| 1  | 0  | 2  | 0  | 5  | 0  | 8            |
| 0  | 1  | 0  | 1  | 0  | 1  | 3            |
| 0  | 1  | 0  | 2  | 0  | 5  | 8            |

Applying Gauss-Jordan to this matrix by Matlab's "rref(R)" will provide

| e1 | e2 | e3 | e4 | e5 | e6 | r |
|----|----|----|----|----|----|---|
| 1  | 0  | 0  | 0  | 0  | 0  | 1 |
| 0  | 1  | 0  | 0  | 0  | 0  | 1 |
| 0  | 0  | 1  | 0  | 0  | 0  | 1 |
| 0  | 0  | 0  | 1  | 0  | 0  | 1 |
| 0  | 0  | 0  | 0  | 1  | 0  | 1 |
| 0  | 0  | 0  | 0  | 0  | 1  | 1 |
| 0  | 0  | 0  | 0  | 0  | 0  | 0 |
| 0  | 0  | 0  | 0  | 0  | 0  | 0 |
| 0  | 0  | 0  | 0  | 0  | 0  | 0 |
| 0  | 0  | 0  | 0  | 0  | 0  | 0 |

This provides the value 1 for each of the errors e1, e2, e3, e4, e5 and e6 which should be subtracted from the value of the received corresponding data symbols.

Unfortunately Gauss Jordan does not work directly on a situation wherein 3 rows and 3 columns appear to be in error. In such a case one presumably has potentially 3×3 or 9 errors, with 6+6=12 equations. However the set turns out to be under-determined. One may check such situations by determining if a rank for Ax=0 and Ax+B=0 are identical.

One may assume that the rows will not exceed the maximum number of errors. By reducing the unknowns with just one makes the set of equations solvable. For instance one may have the error situation as provided in the following table

|    | 1  | 2  | 3  | 4 | 5 | r1 | r2 |
|----|----|----|----|---|---|----|----|
| 1  | e1 | e2 | e3 |   |   | 2  | 3  |
| 2  | e4 | e5 | e6 |   |   | 2  | 3  |
| 3  | e7 | e8 | e9 |   |   | 2  | 7  |
| 4  |    |    |    |   |   |    |    |
| 5  |    |    |    |   |   |    |    |
| q1 | 2  | 3  | 1  |   |   |    |    |
| q2 | 3  | 8  | 5  |   |   |    |    |

The check symbols imply that there may be 9 errors. However, the error condition dictates that no more than 2 errors occur in a row. Accordingly at least one error is 0. For instance assume e3=0 and solve the 8 remaining errors with Gauss Jordan with for instance Matlab statement 'rref(A)'. This set is solvable and provides the correct errors. Accordingly, one may develop an iterative scheme and assuming that one or more of the assumed errors are actually 0 and solving the remaining error equations. One may also add one or more check symbols to for instance a column which thus makes a set of equations solvable. A matrix suggests a symmetry wherein all columns (and all rows) have the same number of check symbols. However such symmetry is not required and one may add check symbols to any row or column.

In general, one connects a product code to a single matrix, wherein data symbols in each row or column determines a check symbol, which is also related to a row or a column. It was shown in U.S. patent application Ser. No. 11/680,719 filed on Mar. 1, 2007 and which is incorporated herein in its entirety that there are advantages to assign check symbols to data symbols that are not strictly assigned to a single column or row. Such an approach can be used to "unhide" data symbols that are correct or in error. From the above, it should be clear that there are situations wherein there may be sufficient check symbols to solve the actual errors, if only one can determine where they are located. Reed-Solomon codes provide the redundancy to solve up to k/2 symbols in error if one has k or k+1 check symbols. In many cases one does not want this overhead or redundancy.

In accordance with a further aspect of the present invention one may combine aspects as disclosed above with check symbols determined from data symbols that are not strictly in one column or one column of 1 matrix. The following illustrative example illustrates this approach.

Assume one has 16 n-state symbols arranged in a 4 by 4 matrix. A check symbol may be determined over each instance of a dimension (rows and columns). This is shown in the following table.

| x11 | x12 | x13 | x14 | s1 |
|-----|-----|-----|-----|----|
| x21 | x22 | x23 | x24 | s2 |
| x31 | x32 | x33 | x34 | s3 |
| x41 | x42 | x43 | x44 | s4 |
| p1  | p2  | p3  | p4  |    |

The symbols xij are the data symbols. The symbols si and pj are check symbols determined over rows and columns respectively. One may add check symbols for the check symbols, which may be assumed herein. Assume that one all check symbols are error free after reception. Assume also that x11, x22 and x33 are in error after transmission. This means that check s1, s2, s3, p1, p2 and p3 will indicate an error. This means that one has potentially 9 errors or unknowns that have to be solved, which is not possible. One may determine 4 additional check symbols for error detection which are determined for instance as q1=F(x11, x22, x33, x44); q2=G(x12, x23, x34, x41); q3=H(x13, x24, x31, x42); and q4=I(x14, x21, x32, x43). The functions F, G, H and I may be different, they may also be identical. The following table shows the dependencies of check symbols:

| x11 | x12 | x13 | x14 | x21 | x22 | x23 | x24 | x31 | x32 | x33 | x34 | x41 | x42 | x43 | x44 | cs |
|---|---|---|---|---|---|---|---|---|---|---|---|---|---|---|---|---|
| 1 | 1 | 1 | 1 | 0 | 0 | 0 | 0 | 0 | 0 | 0 | 0 | 0 | 0 | 0 | 0 | e |
| 0 | 0 | 0 | 0 | 1 | 1 | 1 | 1 | 0 | 0 | 0 | 0 | 0 | 0 | 0 | 0 | e |
| 0 | 0 | 0 | 0 | 0 | 0 | 0 | 0 | 1 | 1 | 1 | 1 | 0 | 0 | 0 | 0 | e |
| 0 | 0 | 0 | 0 | 0 | 0 | 0 | 0 | 0 | 0 | 0 | 0 | 1 | 1 | 1 | 1 |   |
| 1 | 0 | 0 | 0 | 1 | 0 | 0 | 0 | 1 | 0 | 0 | 0 | 1 | 0 | 0 | 0 | e |
| 0 | 1 | 0 | 0 | 0 | 1 | 0 | 0 | 0 | 1 | 0 | 0 | 0 | 1 | 0 | 0 | e |
| 0 | 0 | 1 | 0 | 0 | 0 | 1 | 0 | 0 | 0 | 1 | 0 | 0 | 0 | 1 | 0 | e |
| 0 | 0 | 0 | 1 | 0 | 0 | 0 | 1 | 0 | 0 | 0 | 1 | 0 | 0 | 0 | 1 |   |
| 1 | 0 | 0 | 0 | 0 | 1 | 0 | 0 | 0 | 0 | 1 | 0 | 0 | 0 | 0 | 1 | e |
| 0 | 1 | 0 | 0 | 0 | 0 | 1 | 0 | 0 | 0 | 0 | 1 | 1 | 0 | 0 | 0 | G |
| 0 | 0 | 1 | 0 | 0 | 0 | 0 | 1 | 1 | 0 | 0 | 0 | 0 | 1 | 0 | 0 | H |
| 0 | 0 | 0 | 1 | 1 | 0 | 0 | 0 | 0 | 1 | 0 | 0 | 0 | 0 | 1 | 0 | I |

The column cs shows with an 'e' if the check symbol indicates an error. The check symbols indicated in the rows containing G, H and I may assumed to be error free. One may turn the ones in the rows indicated by 'e' in the columns of rows with G, H and I from a 1 into a 0. This is shown in the following table.

| x11 | x12 | x13 | x14 | x21 | x22 | x23 | x24 | x31 | x32 | x33 | x34 | x41 | x42 | x43 | x44 | cs |
|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | e |
| 0 | 0 | 0 | 0 | 0 | 1 | 0 | 0 | 0 | 0 | 0 | 0 | 0 | 0 | 0 | 0 | e |
| 0 | 0 | 0 | 0 | 0 | 0 | 0 | 0 | 0 | 0 | 1 | 0 | 0 | 0 | 0 | 0 | e |
| 0 | 0 | 0 | 0 | 0 | 0 | 0 | 0 | 0 | 0 | 0 | 0 | 1 | 1 | 1 | 1 |   |
| 1 | 0 | 0 | 0 | 0 | 0 | 0 | 0 | 0 | 0 | 0 | 0 | 1 | 0 | 0 | 0 | e |
| 0 | 0 | 0 | 0 | 0 | 1 | 0 | 0 | 0 | 0 | 0 | 0 | 0 | 1 | 0 | 0 | e |
| 0 | 0 | 0 | 0 | 0 | 0 | 0 | 0 | 0 | 0 | 1 | 0 | 0 | 0 | 1 | 0 | e |
| 0 | 0 | 0 | 0 | 0 | 0 | 0 | 0 | 0 | 0 | 0 | 0 | 0 | 0 | 0 | 1 |   |
| 1 | 0 | 0 | 0 | 0 | 1 | 0 | 0 | 0 | 0 | 1 | 0 | 0 | 0 | 0 | 1 | e |
| 0 | 1 | 0 | 0 | 0 | 0 | 1 | 0 | 0 | 0 | 0 | 1 | 1 | 0 | 0 | 0 | G |
| 0 | 0 | 1 | 0 | 0 | 0 | 0 | 1 | 1 | 0 | 0 | 0 | 0 | 1 | 0 | 0 | H |
| 0 | 0 | 0 | 1 | 1 | 0 | 0 | 0 | 0 | 1 | 0 | 0 | 0 | 0 | 1 | 0 | I |

The above process of changes 1 has been highlighted by making the 0s bold and underlined. One can now read from the first three rows which symbols are in error: x11, x22 and x33, indicated by the 1s. By using the expressions to determine the check symbols in reverse one may solve the errors.

One may provide a more elaborate example by also making x12 in error. This will lead to the following table:

| x11 | x12 | x13 | x14 | x21 | x22 | x23 | x24 | x31 | x32 | x33 | x34 | x41 | x42 | x43 | x44 | cs |
|---|---|---|---|---|---|---|---|---|---|---|---|---|---|---|---|---|
| 1 | 1 | 1 | 1 | 0 | 0 | 0 | 0 | 0 | 0 | 0 | 0 | 0 | 0 | 0 | 0 | e |
| 0 | 0 | 0 | 0 | 1 | 1 | 1 | 1 | 0 | 0 | 0 | 0 | 0 | 0 | 0 | 0 | e |
| 0 | 0 | 0 | 0 | 0 | 0 | 0 | 0 | 1 | 1 | 1 | 1 | 0 | 0 | 0 | 0 | e |
| 0 | 0 | 0 | 0 | 0 | 0 | 0 | 0 | 0 | 0 | 0 | 0 | 1 | 1 | 1 | 1 |   |
| 1 | 0 | 0 | 0 | 1 | 0 | 0 | 0 | 1 | 0 | 0 | 0 | 1 | 0 | 0 | 0 | e |
| 0 | 1 | 0 | 0 | 0 | 1 | 0 | 0 | 0 | 1 | 0 | 0 | 0 | 1 | 0 | 0 | e |
| 0 | 0 | 1 | 0 | 0 | 0 | 1 | 0 | 0 | 0 | 1 | 0 | 0 | 0 | 1 | 0 | e |
| 0 | 0 | 0 | 1 | 0 | 0 | 0 | 1 | 0 | 0 | 0 | 1 | 0 | 0 | 0 | 1 |   |
| 1 | 0 | 0 | 0 | 0 | 1 | 0 | 0 | 0 | 0 | 1 | 0 | 0 | 0 | 0 | 1 | e |

| x11 | x12 | x13 | x14 | x21 | x22 | x23 | x24 | x31 | x32 | x33 | x34 | x41 | x42 | x43 | x44 | cs |
|---|---|---|---|---|---|---|---|---|---|---|---|---|---|---|---|---|
| 0 | 1 | 0 | 0 | 0 | 0 | 1 | 0 | 0 | 0 | 0 | 1 | 1 | 0 | 0 | 0 | e |
| 0 | 0 | 1 | 0 | 0 | 0 | 0 | 1 | 1 | 0 | 0 | 0 | 0 | 1 | 0 | 0 | H |
| 0 | 0 | 0 | 1 | 1 | 0 | 0 | 0 | 0 | 1 | 0 | 0 | 0 | 0 | 1 | 0 | I |

Applying the above technique will lead to:

| x11 | x12 | x13 | x14 | x21 | x22 | x23 | x24 | x31 | x32 | x33 | x34 | x41 | x42 | x43 | x44 | cs |
|---|---|---|---|---|---|---|---|---|---|---|---|---|---|---|---|---|
| 1 | 1 | 0 | 0 | 0 | 0 | 0 | 0 | 0 | 0 | 0 | 0 | 0 | 0 | 0 | 0 | e |
| 0 | 0 | 0 | 0 | 0 | 1 | 1 | 0 | 0 | 0 | 0 | 0 | 0 | 0 | 0 | 0 | e |
| 0 | 0 | 0 | 0 | 0 | 0 | 0 | 0 | 0 | 0 | 1 | 0 | 0 | 0 | 0 | 0 | e |
| 0 | 0 | 0 | 0 | 0 | 0 | 0 | 0 | 0 | 0 | 0 | 0 | 1 | 1 | 1 | 1 |   |
| 1 | 0 | 0 | 0 | 0 | 0 | 0 | 0 | 0 | 0 | 0 | 0 | 0 | 0 | 0 | 0 | e |
| 0 | 1 | 0 | 0 | 0 | 0 | 1 | 0 | 0 | 0 | 0 | 0 | 0 | 1 | 0 | 0 | e |
| 0 | 0 | 0 | 0 | 0 | 0 | 0 | 0 | 0 | 1 | 0 | 0 | 0 | 0 | 1 | 0 | e |
| 0 | 0 | 0 | 1 | 0 | 0 | 0 | 0 | 0 | 0 | 0 | 1 | 0 | 0 | 0 | 1 |   |
| 1 | 0 | 0 | 0 | 0 | 1 | 0 | 0 | 0 | 1 | 0 | 0 | 0 | 0 | 0 | 1 | e |
| 0 | 1 | 0 | 0 | 0 | 0 | 1 | 0 | 0 | 0 | 1 | 1 | 0 | 0 | 0 | 0 | e |
| 0 | 0 | 1 | 0 | 0 | 0 | 0 | 1 | 1 | 0 | 0 | 0 | 0 | 1 | 0 | 0 | H |
| 0 | 0 | 0 | 1 | 1 | 0 | 0 | 0 | 0 | 1 | 0 | 0 | 0 | 0 | 1 | 0 | I |

One should project all the ones in rows that are known to be correct as 0 into the rows assumed to be in error. The above table suggests that x11, x12, x22, x23, and x33 may be in error. There are several ways to solve the errors. The simplest way is to clean up iteratively by first determining which row or column has only one error (column 1). Solve x11 in this column. Now row 1 has only one error, so solve x12. Now column 2 has only one error, so solve x22. Now row 2 has only one error, solve x23. Finally solve x33. Other approaches are also possible. For instance one may recalculate the check symbols every time an error has been resolved. There are sufficient equations to solve the unknowns (even if the unknowns are not in error). One may solve a set of equations to determine all unknowns.

The above example shows only the dependency of check symbols with the re-arranged n-state symbols in a matrix. The number of n-state-symbols in the first and the second matrix are preferably the same. Strictly speaking, that requirement is not absolutely necessary. For instance, one may use a second matrix for errors only occurring in the start of the rows of the first matrix. In the example, the check symbols in the second matrix are used for error detection. It should be clear that one can arrange a second matrix and create r≥different and independent check symbols per row or column. One may then use the expressions that are used to generate the check symbols to create systems of equations with the expressions of the first matrix to resolve errors. One may also create a different third matrix along the lines of the second matrix but with different jumps in index to unhide hidden errors.

All steps to resolve the errors in a decoder are deterministic, though they can be iterative, by cleaning errors from a row or column in a matrix that has a number of errors that is not greater than the number of check symbols associated with a row or a column. After an error has been resolved in a row of a matrix, it also diminishes the number of errors in the corresponding column of the matrix. This may put the total number of errors in a column in a condition of being equal or smaller than the related number of check symbols, which makes all errors in that column solvable. It also may be the case that by solving an error in a row of a first matrix, the numbers of errors in a row or a column in a related second matrix have become such that the errors have become solvable. It should be clear that while the above approach is illustrated by using errors in a row, it applies to solving errors in a column or in any other dimension in a k-dimensional matrix.

The selection of the size of a matrix depends among other aspects on the expected number of errors, and if errors are expected to appear in bursts or completely random. Errors may also be introduced deliberately.

The above approach works well with random errors and adjacent errors. Especially when n-state symbols are transmitted as binary words, it is possible that burst errors will affect at least two adjacent n-state symbols or words.

It should be understood that a matrix code is a virtual matrix made up from data symbols and calculated check symbols. In general symbols will not be transmitted as a matrix, but for instance sequentially in a frame of symbols. At the receiving end the virtual matrix can be reconstructed by assigning each symbol in a frame a position in the virtual matrix, which may for instance be stored in an addressable electronic memory.

In accordance with a further aspect of the present invention, the here provided methods and apparatus for error correction by error detection and symbol reconstruction can be used in a system, such as a communication system. A communication system may be a wired system or a wireless system. Such a system may be used for data transmission, telephony, video or any other type of transfer of information. A diagram of such a system is provided in FIG. 9. Herein 901 is a source of information. The information is provided to a coder 902. The information provided to a coder 902 may already be in a digital form. It may also be converted into digital form by the coder 902. The coder 902 creates the code words of a plurality of data symbols with added check symbols as described herein as another aspect of the present invention. The codewords are organized in such a way that up to a number of symbols in error can be identified as such. The thus created codewords may be provided directly to a medium 903 for transmission. They may also be provided to a modulator/transmitter 906 that will modify the digital coded signal provided by 902 to a form that is appropriate for the medium 903. For instance, 906 may create an optical signal, which may be written on an optical disk, or provided to a transmission medium such as an optical fiber. Modulator 906 may also be a radio transmitter, which will modulate the signal on for instance a carrier signal, and wherein 903 is a radio connection. Not specifically shown, but assumed, is circuitry as known to one of ordinary skill in the art to provide and insert "housekeeping" signals, which may include synchronization signals or other signals to assist a receiver to receive, demodulate, decode and display a signal.

At the receiving side a receiver 907 may receive, amplify, and demodulate the signal coming from 903 and provide a digital signal to a decoder 904. The decoder 904 identifies if and which symbols are in error in accordance with another aspect of the present invention and then applies the methods provided herein to correct symbols in error. A decoded and error corrected signal is then provided to a target 905. Such a target may be a radio, a phone, a computer, a tv set or any other device that can be a target for an information signal. A coder 902 may also provide additional coding means, for instance to form a concatenated or combined code. In that case, the decoder 904 has equivalent means to decode the additional coding. Additional information, such as synchronization, frame or ID information, may be inserted during the transmission and/or coding process.

Figure 10:
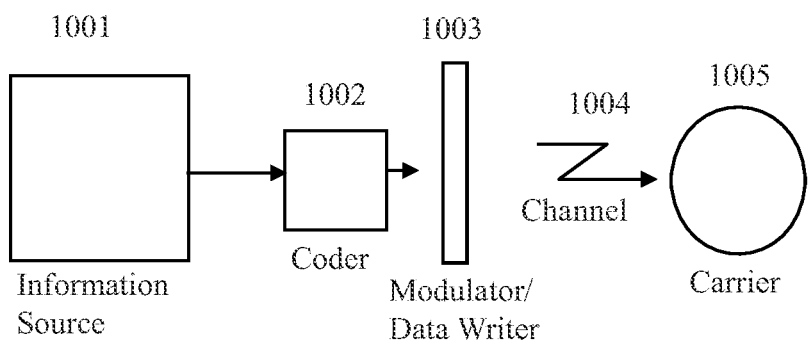
FIG. 10 illustrates a storage system for writing data to a storage medium in accordance with yet another aspect of the present invention.

In accordance with another aspect of the present invention, the here provided methods and apparatus for error correcting coding and decoding of signals can also be applied for systems and apparatus for storage of information. For instance, data stored on a CD, a DVD, a magnetic tape or disk or in mass memory in general may benefit from error correcting coding. A system for storing error correcting symbols in accordance with another aspect of the present invention is shown in diagram in FIG. 10. A source 1001 provides the information to be coded. This may be audio, video or any information data. The data may already be presented in n-valued symbols by 1001 or may be coded in such a form by 1002. Unit 1002 also creates the code words of a plurality of data symbols with added check symbols as described herein as another aspect of the present invention. Codewords are organized in such a way that up to a number of symbols in error can be identified as such. The thus created codewords may be provided directly to a channel 1004 for transmission to an information carrier 1005. In general, a modulator/data writer 1003 will be required to write a signal to a carrier 1005. For instance the channel requires optical signals or it may require magnetic or electromagnetic or electro-optical signals. Modulator/data writer 1003 will create a signal that can be written via channel 1004 to a carrier 1005. Important additional information such as for ID and/or synchronization may be added to the data.

Accordingly, apparatus and methods for error detection and error correction as provided herein may be part of an audio player, a video player, a communication device, a storage device or any other device or system that may benefit from correction of errors in a signal. For instance it may be part or implemented in a mobile computing device such as a mobile phone or a personal digital assistant (PDA). It may also be part of a computer. It may also be part of any computing device that is enabled to receive and exchange data, either through a network or via a storage medium. A storage medium may be an optical disk, a magnetic disk or an electronic medium. Such media may store binary symbols and store n-state symbols as binary words such as bytes. It may also store n-state symbols as multi-state symbols, each symbol having one of 3 or more states. A computing device implementing one or more of the methods and/or n-state expressions may be connected to a network. Such a network may be a wired or a wireless network. The network may be the Internet. It may also be a single connection to another apparatus. Communication may take place with binary symbols, analog signals or signals being a multi-state symbol having one of 3 or more states, such as 16-QAM signals or any other signal that can have one of 3 or more states. A signal may be an electronic signal, a radio signal, an optical signal, an acoustical signal, a mechanical signal, a quantum mechanical signal, a chemical or bio-chemical signal that is able to transmit a symbol having one of 3 or more states.

Figure 11:
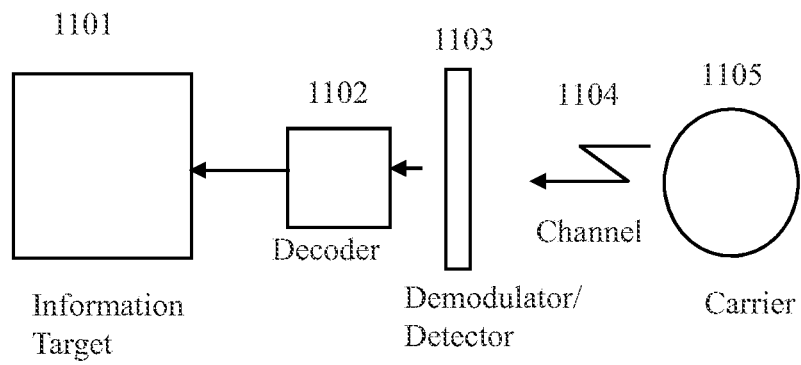
FIG. 11 illustrates a storage system for reading data from a storage medium in accordance with yet another aspect of the present invention.

FIG. 11 shows a diagram for error correcting decoding information read from a carrier 1105. The information is read through a channel 1104 (such as an optical channel or magnetic or electro-magnetic or electro-optical) and provided in general to a detector 1103 that will receive and may amplify and or demodulate the signal. The signal is provided to a decoder 1102 where error detection and error correction takes place. The information signal, possibly readied for presentation as an audio or video signal or any other form, is then provided to a target 1101. The target may be a video screen, a computer, a radio or any other device that can use the decoded signal.

Not shown, but assumed, in all applications may be circuitry that performs housekeeping tasks such as synchronization, equalization, amplification, filtering, D/A and A/D conversion and the like to facilitate the processing of a signal.

The methods of error detection and error correction can be implemented in accordance with an aspect of the present invention in an apparatus that can perform the steps of the methods. The implementation can take place in a program with instructions that can be stored in a memory and that can be retrieved by a processor for execution. One may also implement the methods in accordance with an aspect of the present invention in dedicated hardware that will perform the steps of the methods. Such hardware may comprise custom designed circuitry. Such circuitry may be n-state circuitry that implements at least one of the n-state switching functions that is used in either determining a check symbol or to detect or to correct a symbol in error. Such hardware may also comprise programmable units that can be programmed to perform a certain function such as Field Programmable Gate Arrays. Instructions may also be implemented in binary logic circuitry, combined with Analog/Digital conversion circuitry to convert an n-state signal into a binary signal; or with Digital/Analog converter circuitry to convert a binary signal into an n-state signal.

One may represent an n-state symbol by an n-state signal with $n>2$. Such an n-state signal may be an n-level signal, wherein a state may be represented by one of n voltage levels or intensity levels with n greater than 2. One may also represent an n-state symbol with a signal that can assume one of n states which are linear independent, so that linear addition of 2 or more n-state signals will not create another n-state signal with n greater than 2. One may also represent an n-state symbol by a plurality of p-state symbols with $p<n$. One may also consider a plurality of binary signals to represent an n-state symbol. One may process an n-state symbol by a processor implementing an n-state switching function which may be represented by at least an n by n truth table. One may also process a plurality of binary signals as representing an n-state symbol by a binary processor, wherein the binary processor processes the plurality of binary symbols by a binary implementation of an n-state logic function in binary form and wherein the n-state logic function can be represented by at least an n-by-n truth table with $n>2$.

As an example one may process a plurality of binary signals as if 3 binary signals represent for instance an 8-state symbol. One may then process binary words wherein each word is formed by 3 bits by an implementation of an 8-state switching function. Such a function may be for instance the following function sc8 which is provided in 8-state notation and in binary notation as sc8b.

| sc8 | 0 | 1 | 2 | 3 | 4 | 5 | 6 | 7 | sc8b | 000 | 001 | 010 | 011 | 100 | 101 | 110 | 111 |
|---|---|---|---|---|---|---|---|---|---|---|---|---|---|---|---|---|---|
| 0 | 0 | 1 | 2 | 3 | 4 | 5 | 6 | 7 | 000 | 000 | 001 | 010 | 011 | 100 | 101 | 110 | 111 |
| 1 | 1 | 0 | 3 | 2 | 5 | 4 | 7 | 6 | 001 | 001 | 000 | 011 | 010 | 101 | 100 | 111 | 110 |
| 2 | 2 | 3 | 0 | 1 | 6 | 7 | 4 | 5 | 010 | 010 | 011 | 000 | 001 | 110 | 111 | 100 | 101 |
| 3 | 3 | 2 | 1 | 0 | 7 | 6 | 5 | 4 | 011 | 011 | 010 | 001 | 000 | 111 | 110 | 101 | 100 |
| 4 | 4 | 5 | 6 | 7 | 0 | 1 | 2 | 3 | 100 | 100 | 101 | 110 | 111 | 000 | 001 | 010 | 011 |
| 5 | 5 | 4 | 7 | 6 | 1 | 0 | 3 | 2 | 101 | 101 | 100 | 111 | 110 | 001 | 000 | 011 | 010 |
| 6 | 6 | 7 | 4 | 5 | 2 | 3 | 0 | 1 | 110 | 110 | 111 | 100 | 101 | 010 | 011 | 000 | 001 |
| 7 | 7 | 6 | 5 | 4 | 3 | 2 | 1 | 0 | 111 | 111 | 110 | 101 | 100 | 011 | 010 | 001 | 000 |

Figure 12:
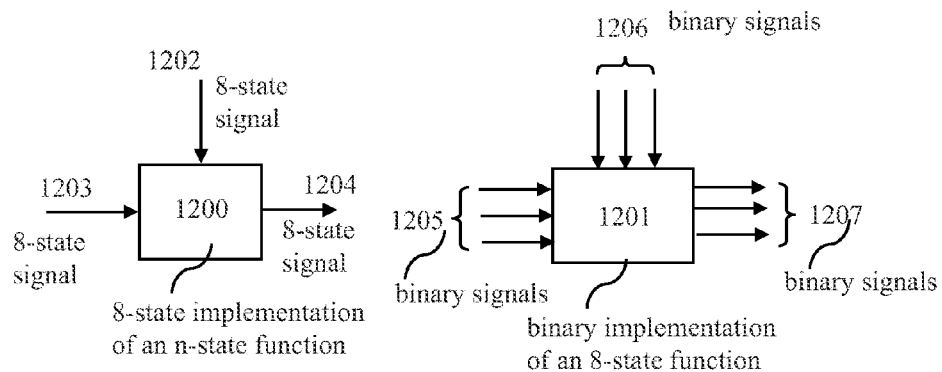
FIGS. 12 and 13 illustrate an implementation of an n-state truth table.

FIG. 12 shows an n-state implementation 1200 of function sc8, having an input 1202 and 1203, each enabled to receive an 8-state signal and an output 1204 that can provide an 8-state signal in accordance with the truth table of sc8. The implementation of the function sc8 may be based on components as disclosed in U.S. Pat. No. 7,218,144 issued on May 15, 2007, or with U.S. patent application Ser. No. 11/964,507 filed on Dec. 26, 2007, which are both incorporated herein by reference in their entirety. FIG. 12 also shows a binary implementation of the truth table sc8b, which is equivalent to sc8. An 8-state symbol herein may be provided as a word of 3 parallel bits on a set of 3 inputs 1205 and 1206. An 8-state symbol is then provided in accordance with the truth table of sc8b on the set of 3 outputs 1207. The binary implementation of sc8b can be 3 parallel devices implementing an XOR function. One can easily check that the output word of sc8b is created by taken the XOR of the 3 bits of a first word provided on input 1205 with the 3 bits of binary word provided on 1206.

Figure 13:
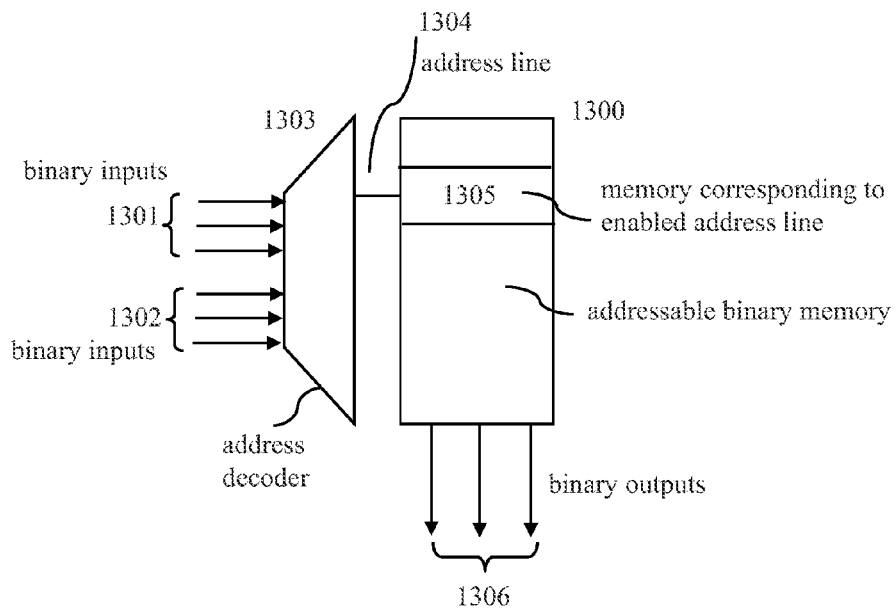

A further possible implementation of the truth table of sc8b is shown in FIG. 13, wherein an addressable binary storage memory 1300 is used. It applies an address decoder 1303, which is provided on 2 sets of 3 inputs 1301 and 1302 with 2 binary words of 3 bits. Based on the inputted 6 bits the address decoder enables a corresponding address line 1304, which enables the reading of a content of a memory 1305. This content is provided on the output set 1306 of 3 outputs. The relation between the input address and the binary output of the device of FIG. 13 is provided by the truth table of sc83.

In accordance with a further aspect of the present invention all multi-state symbols may be represented and processed in binary form as a plurality of binary symbols. It should be clear that in such a situation one should apply means to synchronize all symbols in accordance with the symbols they represent. One may also use multi-state symbols during part of a process and binary or other representation and processing during a different stage of processing. As an example it is known to use multi-state symbols for transmission of symbols. One may, if so desired, prepare and process the multi-state symbols in for instance binary form before actual transmission.

The present invention may be used in the detection and correction of errors that may have occurred after coding, but before decoding, for instance during but not limited to the transmission of symbols or signals. Errors may be caused by noise superimposed on a transmitted signal that was attenuated in strength during transmission. It is well known that the correction and/or detection of errors in signals before further processing is useful. It may prevent extraction and use of information that is no longer correct due to errors. It may prevent inaccurate playing of audio and/or video signals, which may be experienced by a user as noise or a nuisance. It may make possible the use of noisy and/or a scarce transmission medium such as a radio spectrum. Failure to correct errors may make use of a medium impossible. Accordingly, error correction is desirable and useful. Error correction requires redundancy in a signal. The ability to correct more errors with the same number of check symbols as in known and earlier applied methods is very advantageous, as it improves the use of spectrum and bandwidth. What one does is exchanging processing capability with bandwidth or number of users.

In a further embodiment of the present invention one may introduce deliberate errors in a signal as an annoyance or a security factor. In a further embodiment one may introduce errors at a rate that affects the quality of the use of received symbols or signals. Deliberate errors may be introduced at known positions in a frame of symbols, and may be considered erasures. In such situations, one knows at sending where errors are located. Information on where errors are located may be based on a predetermined scheme of which a receiving apparatus is aware or is made aware by an authority or by a signal.

In accordance with a further aspect of the present invention, errors may be deliberately introduced at known positions in a sequence of symbols, or errors may be introduced at random in a sequence of symbols. If errors are introduced at random, the number of errors that is introduced should be within the number of errors that can be solved by an error correction scheme. For instance, one may introduce errors deliberately that may be resolved by a Reed Solomon error correcting scheme. It is noted that RS codes are able to resolve a number of errors that is about half of the number of related check symbols. Furthermore, RS solving schemes are generally known. For error introduction to be effective, by requiring a specific and unique error correction approach, one may generate check symbols in a unique way that is not generally known. Otherwise, a normal RS error correcting scheme may be applied to solve the nuisance errors, thus rendering the nuisance errors ineffective. Unique methods and apparatus for generating RS-like codes and check symbols, are disclosed by the inventor in U.S. patent application Ser. No. 11/739,189 filed on Apr. 24, 2007; U.S. patent application Ser. No. 11/775,963 filed on Jul. 11, 2007; U.S. patent application Ser. No. 11/743,893 filed on May 3, 2007; and U.S. patent application Ser. No. 11/969,560 filed on Jan. 4, 2008 which are all four incorporated herein by reference in their entirety.

In accordance with an aspect of the present invention, a receiving apparatus thus is able to identify a position of a symbol deliberately put in error without requiring the application of check symbols. Information on a position of an n-state symbol deliberately put in error may be part of a receiving apparatus; it may be embedded in an apparatus, for instance as instructions in a program that can be executed by the receiving apparatus or it may be stored as data in a memory that can be read and processed by the receiving apparatus. A receiving apparatus may also be provided with the means to identify symbols that have been put deliberately in error, for instance by receiving and processing a signal, or by reading specific data to that effect from a storage medium, such as an optical disk, a memory or a magnetic disk or tape, or any other known storage medium. Such information may also be provided to a receiving apparatus via a network. Such network may be the Internet or via any other connection that allows a receiving apparatus to receive information related to symbols deliberately put in error.

For instance, one may have a playing apparatus, such as an audio player or a video player for playing an audio or video program that is played by processing a stream of digital signals. The stream of digital symbols may contain a plurality of symbols that is put deliberately in error. Such programs may still be playable, but may contain interference or noise-like features or other error like effects that diminish the quality of the displayed program. In a first embodiment, a player may be provided with information about the position of symbols in error. In a further embodiment, the player may be provided with means to use the information about the position of errors to minimize the effect of the deliberate errors. For instance a sender or originator of the deliberate errors may make an error by providing a symbol a state that represents the maximum intensity of a sound or a pixel. A receiver, knowing where the symbols in error are, may provide the symbols in error with a state that represents their lowest value. This does not eliminate the error, but may diminish its effect. In a further embodiment, one may also apply a program that interpolates a value for a symbol in error, based on preceding and succeeding symbols that are not in error. This may help to overcome all or part of the errors.

In a further embodiment, the deliberate errors may be put in a transmitted and to be received signal, so that they form a burst error in the displayed signal. Signals that are provided on Compact Disc or on DVD for instance, but also on transmitted signals, may be interleaved. Burst errors in a received signal or in a signal that is read from a storage medium is spread over different frames or displayed signals after de-interleaving. By positioning errors in a burst at pre-interleaving, one may enhance the annoyance effect that is difficult to overcome by interpolation measures.

In a further embodiment, one may provide a receiving or displaying apparatus with data or information, which may include instructions or rules for determining the check symbols, that allows the receiving apparatus or player to correct the symbols that were put deliberately in error, using also the position information on those errors. The correct decoding and/or position information of errors may be provided to an apparatus as a separate signal or as part of a signal containing the program to be displayed. Such data may be provided over a network such as the Internet or over a wireless network or via any other communication connection that can be used to transmit data. That data may also be embedded on a storage medium. Such information or data may be made available in such a way that only authorized players or apparatus may use it to correct deliberately introduced errors.

In yet a further embodiment one may provide errors deliberately in known positions by processing the correct symbol with a known symbol by using a reversible n-state switching function. One embodiment, using reversible n-state switching functions and known n-state symbols, is disclosed in U.S. patent application Ser. No. 10/912,954 filed on Aug. 6, 2004 and Ser. No. 12/264,728, filed on Nov. 4, 2008 which are both incorporated herein by reference in their entirety. These applications apply self reversing n-state switching functions. It should be clear that any reversible n-state switching function may be applied to modify (or scramble) a symbol in a known position. It is pointed out that scrambling is different from introducing errors. For correcting errors, one requires redundancy, such as providing check symbols. Descrambling does not require redundancy with check symbols, if one knows which symbols have been scrambled. However, for descrambling one requires at the receiving end information which symbols were scrambled, what the known symbols are against which the symbols were scrambled and the reversible function(s) that were applied to change the symbols. Cryptanalysis, including statistical analysis, may be applied to find the appropriate n-state functions and the "known symbols". In a further embodiment, one may use a scrambler to provide errors to symbols in known positions, but apply error correction using check symbols as for instance provided herein or in any of the references incorporated herein by reference to correct those errors.

For security or other reasons a signal may be scrambled, thus preventing playing of the signal on for instance an audio or video display if an appropriate descrambler is not applied. In general, a complete signal is scrambled, thus preventing the complete display of the signal. It would be beneficial to scramble only part of the signal. This would allow a user to evaluate the content of the signal, for instance for purchasing it. One may for instance scramble part of a video program in such a way that one may view part of a screen, or for instance one may view a screen at a much lower than optimal quality.

For instance, one may apply an error ratio that affects the quality of an audio and/or video signal during display if errors are not corrected. One may apply an error ratio of correctable errors that makes display of these signals as an audio or video signal unusable. In a further embodiment, one may introduce correctable errors at a rate at which one can display a video or play an audio signal and discern the content of an image or a sound, however at a quality which can be improved discernibly by correcting the errors. In a further embodiment one may also introduce errors into a signal at a known rate without including check symbols. In one embodiment, one may introduce errors in symbols in known positions in a frame of symbols. One may calculate and include check symbols using implementable binary or n-state expressions that allow a receiver to detect or correct the errors.

In a further embodiment one may keep the expressions required to correct errors secret for a receiver. In a further embodiment, one may provide a receiver with instructions to be implemented in a processor to detect and/or correct symbols in error.

One may create a signal having a first part and a second part, wherein the first part does not have errors introduced and the second part has errors introduced. One may provide a signal that has deliberate errors introduced with check symbols that allow the detection and or correction of these errors at a receiver.

In a first embodiment one may introduce errors in data symbols after check symbols have been calculated. If the errors are detectable and correctable, a receiver with the appropriate error correcting apparatus may correct the errors, providing a full quality signal. In another embodiment one may withhold the error correction means from a receiver. By placing errors in data symbols that are not correctable one may create a deteriorated signal that still has sufficient quality, but a lower quality than what is optimally possible. A user may for instance purchase the appropriate error correction means, in either downloadable code via a network, or on a storage medium and install it on a processor in a receiver so that all introduced errors can be corrected, thus providing an optimal quality signal.

In one aspect of the present invention two or more sets of two or more n-state equations having two or more unknowns have to be resolved, for instance as it relates to solving errors in two or more rows or two or more columns of a matrix having at least two dimensions. One may solve the set of equations serially. In many cases there is a time constraint of the solving of errors, for instance in real time display of signals such as digital video signals. The time available for solving errors is then determined by the constraints imposed by the Nyquist-Shannon sampling theorem. In such a case it may be beneficial to have a separate and/or dedicated processor for solving a set of equations to solve one or more unknowns in a row or a column of n-state data symbols. Each set of equations is thus solved in parallel to others by a processor that implements at least one n-state logic function defined by at least an n by n truth table.

As stated above a processor may be a general processor or a Digital Signal Processor (DSP). A processor may also be dedicated hardware that is hardwired to execute the steps or instructions that are aspects of the present invention. Retrieving instructions thus may mean retrieving instructions from a memory and for instance to be put in an instruction register of a processor to be executed. Retrieving instructions in a hardwired circuit, in the context of this application, may mean starting execution at a first circuit and forcing signals to go through a pre-determined series of circuits. The memory is thus a hardwired memory (hard-wired by connections in and/ or between circuits) and retrieving and executing an instruction is moving of a signal from a previous circuit to a next circuit as is determined by the connections.

While there have been shown, described and pointed, out fundamental novel features of the invention as applied to preferred embodiments thereof, it will be understood that various omissions and substitutions and changes in the form and details of the devices, systems and methods illustrated and in their operation may be made by those skilled in the art without departing from the spirit of the invention. It is the intention, therefore, to be limited only as indicated by the scope of the claims appended hereto.

The following patent applications, including the specifications, claims and drawings, are hereby incorporated by reference herein, as if they were fully set forth herein: (1) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (2) U.S. Pat. No. 7,002,490 issued on Feb. 21, 2006, entitled TERNARY AND HIGHER MULTI-VALUE SCRAMBLERS/DESCRAMBLERS; (3) U.S. Non-Provisional patent application Ser. No. 10/912,954, filed Aug. 6, 2004, entitled TERNARY AND HIGHER MULTI-VALUE SCRAMBLERS/DESCRAMBLERS; (4) U.S. Non-Provisional patent application Ser. No. 11/042,645, filed Jan. 25, 2005, entitled MULTI-VALUED SCRAMBLING AND DESCRAMBLING OF DIGITAL DATA ON OPTICAL DISKS AND OTHER STORAGE MEDIA; (5) U.S. Pat. No. 7,218,144, issued on May 15, 2007, entitled SINGLE AND COMPOSITE BINARY AND MULTI-VALUED LOGIC FUNCTIONS FROM GATES AND INVERTERS; (6) U.S. patent Ser. No. 11/065,836 filed Feb. 25, 2005, entitled GENERATION AND DETECTION OF NON-BINARY DIGITAL SEQUENCES; (7) U.S. Pat. No. 7,397,690 issued on Jul. 8, 2008, entitled MULTI-VALUED DIGITAL INFORMATION RETAINING ELEMENTS AND MEMORY DEVICES; (8) U.S. Non-Provisional patent application Ser. No. 11/618,986, filed Jan. 2, 2007, entitled Ternary and Multi-Value Digital Signal Scramblers, Descramblers and Sequence Generators; (9) U.S. Non-Provisional patent application Ser. No. 11/679,316 filed Feb. 27, 2007, entitled Methods And Apparatus In Finite Field Polynomial Implementations; (9) U.S. Non-Provisional patent application Ser. No. 11/566,725, filed on Dec. 5, 2006, entitled: Error Correcting Decoding For Convolutional And Recursive Systematic Convolutional Encoded Sequences; (10) U.S. Non-Provisional patent application Ser. No. 11/739, 189, filed on Apr. 24, 2007 entitled: Error Correction By Symbol Reconstruction In Binary And Multi-Valued Cyclic Codes; (11) U.S. Non-Provisional patent application Ser. No. 11/969,560 filed Jan. 4, 2008, entitled: Symbol Error Correction by Error Detection and Logic Based Symbol Reconstruction; (12) U.S. Non-Provisional patent application Ser. No. 11/964,507 filed on Dec. 26, 2007 entitled Implementing Logic Functions With Non-Magnitude Based Physical Phenomena.

The invention claimed is:

1. An apparatus for correcting errors in a sequence of k n-state data symbols and a plurality of n-state check symbols, an n-state symbol being represented by a signal, with n>2, and k greater than 2, comprising:

a memory enabled to store instructions;

a processor that retrieves and executes instructions from the memory to perform the steps of:

receiving on an input the sequence of k n-state symbols and the plurality of n-state check symbols being a plurality of codewords with at least two codewords having no n-state data symbols in common, wherein the n-state check symbols in the plurality of n-state check symbols are determined by a first arrangement of the k n-state data symbols in an at least two-dimensional matrix, wherein for each instance of the at least two-dimensional matrix at least a first and a second n-state check symbol are determined during a coding, by evaluating a first n-state expression to generate the first n-state check symbol and evaluating a second n-state expression to generate the second n-state check symbol, each n-state expression having all the n-state data symbols in an instance for which the n-state check symbols are determined as variables of a degree 1;

arranging the received sequence of k n-state symbols in the first arrangement of the at least two-dimensional matrix, recalculating the first and second n-state check symbols for each instance of the at least two-dimensional matrix and comparing the received and recalculated check symbols to determine instances of the first and second dimensions of the at least two-dimensional matrix that are in error;

determining at least two n-state syndrome equations of degree 1 for one dimension of the at least two-dimensional matrix from a comparison of received and recalculated n-state check symbols, wherein each variable in the at least two n-state syndrome equations has a degree 1 and a first unknown represents an error magnitude of a common n-state symbol in a first instance in error in the first dimension that is common with a first instance in error in the second dimension of the at least two-dimensional matrix;

determining the error magnitude of the common n-state symbol by directly solving the at least two n-state syndrome equations of degree 1 for the first unknown; and generating a correct state of the common n-state symbol by combining the error magnitude with the common n-state symbol by applying an n-state logic function.

2. The apparatus as claimed in claim 1, further comprising instructions to perform:

receiving on the input one or more n-state check-the-check symbols to correct an error in one or more of the n-state check symbols.

3. The apparatus as claimed in claim 1, further comprising instructions to perform:
receiving on the input another plurality of n-state check symbols, wherein the another plurality of n-state symbols is determined by a second arrangement of the k n-state data symbols in the at least two-dimensional matrix;
determining instances in error of the second arrangement of the k n-state data symbols in the at least two-dimensional matrix by recalculating the another plurality of n-state check symbols; and
solving additional errors.

4. The apparatus as claimed in claim 1, wherein a correctable error has been introduced deliberately into at least one of the k n-state symbols.

5. The apparatus as claimed in claim 4, wherein a position of the n-state data symbol placed deliberately in error is known to the apparatus.

6. The apparatus as claimed in claim 4, wherein an instruction to solve the error is provided to the apparatus through a network.

7. The apparatus as claimed in claim 4, wherein an instruction to solve the error is unique to the sequence of k n-state symbols.

8. The apparatus as claimed in claim 1, wherein the n-state reversible logic function is implemented in binary logic.

9. The apparatus as claimed in claim 1, wherein the apparatus is part of at least one of the group consisting of an audio player, a video player, a data storage device, and a communication device.

10. The apparatus of claim 1, wherein the one dimension for the at least two n-state syndrome equations of degree 1 for one dimension of the at least two-dimensional matrix is a dimension with a fewest number of instances in error.

11. A method for correcting an error in an n-state codeword in a plurality of n-state codewords which are part of an n-state product code, the n-state product code containing k n-state data symbols with n and k greater than 2 and a first plurality of n-state check symbols, each n-state symbol being represented by a signal which is enabled to be processed by a processor, comprising:
the processor receiving the plurality of codewords which is formed during a coding and is determined by a first arrangement of the k n-state symbols in an at least two-dimensional matrix with rows and columns indicated as instances, wherein the first plurality of n-state symbols is determined by determining for each instance of the at least two-dimensional matrix a first and a second n-state check symbol by evaluating a first n-state expression to generate the first n-state check symbol and evaluating a second n-state expression to generate the second n-state check symbol, each n-state expression having all the n-state data symbols in an instance for which the n-state check symbols are determined as variables of a degree 1;
the processor placing the received k n-state data symbols in the first arrangement of the at least two-dimensional matrix, recalculating the first and second n-state check symbols for each instance of the at least two-dimensional matrix and comparing the received and recalculated n-state check symbols to determine instances of the first and second dimensions of the at least two-dimensional matrix that are in error;
the processor determining at least two n-state syndrome equations of degree 1 for one dimension of the at least two-dimensional matrix from a comparison of received and recalculated n-state check symbols, wherein each variable in the at least two n-state syndrome equations has a degree 1 and a first unknown represents an error magnitude of a common n-state symbol in a first instance in error in the first dimension that is common with a first instance in error in the second dimension of the at least two-dimensional matrix;
determining a value of the error magnitude of the common n-state symbol by solving the at least two n-state syndrome equations of degree 1 for the first unknown; and
generating a correct state of the common n-state symbol by combining the value of the error magnitude with the n-state symbol in error by applying an n-state logic function.

12. The method of claim 11, further comprising:
receiving one or more n-state check-the-check symbols to correct an error in one or more of the n-state check symbols.

13. The method of claim 11, further comprising:
receiving another plurality of n-state check symbols, wherein the another plurality of n-state symbols is determined by a second arrangement of the k n-state data symbols in the at least two-dimensional matrix;
determining instances in error of the second arrangement of the k n-state data symbols in the at least two-dimensional matrix by recalculating the another plurality of n-state check symbols; and
solving additional errors.

14. The method of claim 11, wherein a correctable error has been introduced deliberately into at least one of the k n-state data symbols.

15. The method of claim 14, wherein a position of the n-state data symbol placed deliberately in error is provided by an external source to the processor.

16. The method of claim 14, wherein an instruction to solve the correctable error is provided to the apparatus through a network.

17. The method of claim 14, wherein data to resolve the correctable error are acquired via a network.

18. The method of claim 14, wherein data to resolve the correctable error is stored on a storage medium.

19. The method of claim 11, wherein the n-state expressions are implemented in binary logic.

20. The method of claim 11, wherein the method is applied to at least one of the group consisting of an audio player, a video player, a data storage device, and a communication device.

* * * * *